(12) United States Patent
Tauzin et al.

(10) Patent No.: US 8,778,775 B2
(45) Date of Patent: Jul. 15, 2014

(54) METHOD FOR PREPARING THIN GAN LAYERS BY IMPLANTATION AND RECYCLING OF A STARTING SUBSTRATE

(75) Inventors: Aurélie Tauzin, Saint Egreve (FR); Jérôme Dechamp, Saint Egreve (FR); Frédéric Mazen, Grenoble (FR); Florence Madeira, Beaulieu (FR)

(73) Assignee: Commissariat a l'Energie Atomique, Paris (FR)

( * ) Notice: Subject to any disclaimer, the term of this patent is extended or adjusted under 35 U.S.C. 154(b) by 1426 days.

(21) Appl. No.: 12/518,198

(22) PCT Filed: Dec. 18, 2007

(86) PCT No.: PCT/FR2007/002100
§ 371 (c)(1),
(2), (4) Date: Jun. 8, 2009

(87) PCT Pub. No.: WO2008/093008
PCT Pub. Date: Aug. 7, 2008

(65) Prior Publication Data
US 2010/0025228 A1    Feb. 4, 2010

(30) Foreign Application Priority Data
Dec. 19, 2006 (FR) ..................... 06 55664

(51) Int. Cl.
*H01L 21/30* (2006.01)
*H01L 21/46* (2006.01)

(52) U.S. Cl.
USPC .................................. 438/458; 257/E21.568

(58) Field of Classification Search
USPC ........................................ 438/458
See application file for complete search history.

(56) References Cited

U.S. PATENT DOCUMENTS 3,901,423 A    8/1975    Hillberry et al.
3,915,757 A    10/1975   Engel
(Continued)

FOREIGN PATENT DOCUMENTS

DE    101 53 319 A1    5/2003
EP    0 355 913       2/1990
(Continued)

OTHER PUBLICATIONS

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

(Continued)

*Primary Examiner* — Calvin Choi
(74) *Attorney, Agent, or Firm* — Brinks Gilson & Lione

(57) ABSTRACT

A method for preparing a thin layer of GaN from a starting substrate in which at least one thick surface area extending along a free face of the starting substrate includes GaN, where the method includes bombarding the free face of the substrate with helium and hydrogen atoms, the helium being implanted first into the thickness of the thick surface area and the hydrogen being implanted thereafter, and where the helium and hydrogen doses each vary between $1.10^{17}$ atoms/cm2 and $4.10^{17}$ atoms/cm2. The starting substrate is subjected to a rupture process in order to induce the separation, relative to a residue of the starting substrate, of the entire portion of the thick area located between the free face and the helium and hydrogen implantation depth. The helium is advantageously implanted in a dose at least equal to that of hydrogen, and can also be implanted alone.

24 Claims, 2 Drawing Sheets

(56) References Cited

U.S. PATENT DOCUMENTS

| | | |
|---|---|---|
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |
| 4,074,139 A | 2/1978 | Pankove |
| 4,107,350 A | 8/1978 | Berg et al. |
| 4,108,751 A | 8/1978 | King |
| 4,121,334 A | 10/1978 | Wallis |
| 4,170,662 A | 10/1979 | Weiss et al. |
| 4,179,324 A | 12/1979 | Kirkpatrick |
| 4,244,348 A | 1/1981 | Wilkes |
| 4,252,837 A | 2/1981 | Auton |
| 4,254,590 A | 3/1981 | Eisele et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,050 A | 9/1985 | Kramler et al. |
| 4,542,863 A | 9/1985 | Larson |
| 4,566,403 A | 1/1986 | Fournier |
| 4,567,505 A | 1/1986 | Pease |
| 4,568,563 A | 2/1986 | Jackson et al. |
| 4,585,945 A | 4/1986 | Bruel et al. |
| 4,630,093 A | 12/1986 | Yamaguchi et al. |
| 4,684,535 A | 8/1987 | Heinecke et al. |
| 4,704,302 A | 11/1987 | Bruel et al. |
| 4,717,683 A | 1/1988 | Parrillo et al. |
| 4,764,394 A | 8/1988 | Conrad |
| 4,832,253 A | 5/1989 | Kloucek et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,887,005 A | 12/1989 | Rough et al. |
| 4,891,329 A | 1/1990 | Reisman et al. |
| 4,894,709 A | 1/1990 | Phillips et al. |
| 4,904,610 A | 2/1990 | Shyr |
| 4,920,396 A | 4/1990 | Shinohara et al. |
| 4,929,566 A | 5/1990 | Beitman |
| 4,931,405 A | 6/1990 | Kamijo et al. |
| 4,948,458 A | 8/1990 | Ogle |
| 4,952,273 A | 8/1990 | Popov |
| 4,956,698 A | 9/1990 | Wang |
| 4,960,073 A | 10/1990 | Suzuki et al. |
| 4,975,126 A | 12/1990 | Margail et al. |
| 4,982,090 A | 1/1991 | Wittmaack |
| 4,996,077 A | 2/1991 | Moslehi et al. |
| 5,013,681 A | 5/1991 | Godbey et al. |
| 5,015,353 A | 5/1991 | Hubler et al. |
| 5,034,343 A | 7/1991 | Rouse et al. |
| 5,036,023 A | 7/1991 | Dautremont-Smith et al. |
| 5,110,748 A | 5/1992 | Sarma |
| 5,120,666 A | 6/1992 | Gotou |
| 5,131,968 A | 7/1992 | Wells et al. |
| 5,138,422 A | 8/1992 | Fujii et al. |
| 5,198,371 A | 3/1993 | Li |
| 5,200,805 A | 4/1993 | Parsons et al. |
| 5,232,870 A | 8/1993 | Ito et al. |
| 5,234,535 A | 8/1993 | Beyer et al. |
| 5,242,863 A | 9/1993 | Xiang-Zheng et al. |
| 5,250,446 A | 10/1993 | Osawa et al. |
| 5,256,581 A | 10/1993 | Foerstner et al. |
| 5,259,247 A | 11/1993 | Bantien |
| 5,280,819 A | 1/1994 | Newkirk et al. |
| 5,300,788 A | 4/1994 | Fan et al. |
| 5,310,446 A | 5/1994 | Konishi et al. |
| 5,374,564 A | 12/1994 | Bruel |
| 5,400,458 A | 3/1995 | Rambosek |
| 5,405,802 A | 4/1995 | Yamagata et al. |
| 5,413,951 A | 5/1995 | Ohori et al. |
| 5,442,205 A | 8/1995 | Brasen et al. |
| 5,494,835 A | 2/1996 | Bruel |
| 5,524,339 A | 6/1996 | Gorowitz et al. |
| 5,539,241 A | 7/1996 | Abidi et al. |
| 5,559,043 A | 9/1996 | Bruel |
| 5,567,654 A | 10/1996 | Beilstein, Jr. et al. |
| 5,611,316 A | 3/1997 | Oshima et al. |
| 5,618,739 A | 4/1997 | Takahashi et al. |
| 5,622,896 A | 4/1997 | Knotter et al. |
| 5,633,174 A | 5/1997 | Li |
| 5,661,333 A | 8/1997 | Bruel et al. |
| 5,714,395 A | 2/1998 | Bruel |
| 5,741,733 A | 4/1998 | Bertagnolli et al. |
| 5,753,038 A | 5/1998 | Vichr et al. |
| 5,804,086 A | 9/1998 | Bruel |
| 5,811,348 A | 9/1998 | Matsushita et al. |
| 5,817,368 A | 10/1998 | Hashimoto |
| 5,854,123 A | 12/1998 | Sato et al. |
| 5,863,830 A | 1/1999 | Bruel et al. |
| 5,863,832 A | 1/1999 | Doyle et al. |
| 5,877,070 A | 3/1999 | Goesele et al. |
| 5,880,010 A | 3/1999 | Davidson |
| 5,882,987 A | 3/1999 | Srikrishnan |
| 5,897,331 A | 4/1999 | Sopori |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,981,400 A | 11/1999 | Lo |
| 5,985,412 A | 11/1999 | Gösele |
| 5,993,677 A | 11/1999 | Biasse et al. |
| 5,994,207 A | 11/1999 | Henley et al. |
| 6,010,591 A | 1/2000 | Gösele |
| 6,013,563 A | 1/2000 | Henley et al. |
| 6,013,954 A | 1/2000 | Hamajima |
| 6,020,252 A | 2/2000 | Aspar et al. |
| 6,033,974 A | 3/2000 | Henley et al. |
| 6,048,411 A | 4/2000 | Henley et al. |
| 6,054,363 A | 4/2000 | Sakaguchi et al. |
| 6,054,370 A | 4/2000 | Doyle |
| 6,057,212 A | 5/2000 | Chan et al. |
| 6,071,795 A | 6/2000 | Cheung et al. |
| 6,080,640 A | 6/2000 | Gardner et al. |
| 6,096,433 A | 8/2000 | Kikuchi et al. |
| 6,103,597 A | 8/2000 | Aspar et al. |
| 6,103,599 A | 8/2000 | Henley et al. |
| 6,118,181 A | 9/2000 | Merchant et al. |
| 6,127,199 A | 10/2000 | Inoue |
| 6,146,979 A | 11/2000 | Henley et al. |
| 6,150,239 A | 11/2000 | Goesele et al. |
| 6,156,215 A | 12/2000 | Shimada et al. |
| 6,159,323 A | 12/2000 | Joly et al. |
| 6,190,998 B1 | 2/2001 | Bruel et al. |
| 6,197,695 B1 | 3/2001 | Joly et al. |
| 6,198,159 B1 | 3/2001 | Hosoma et al. |
| 6,200,878 B1 | 3/2001 | Yamagata et al. |
| 6,204,079 B1 | 3/2001 | Aspar et al. |
| 6,225,190 B1 | 5/2001 | Bruel et al. |
| 6,225,192 B1 | 5/2001 | Aspar et al. |
| 6,251,754 B1 | 6/2001 | Ohshima et al. |
| 6,256,864 B1 | 7/2001 | Gaud et al. |
| 6,271,101 B1 | 8/2001 | Fukunaga |
| 6,276,345 B1 | 8/2001 | Nelson et al. |
| 6,287,940 B1 | 9/2001 | Cole et al. |
| 6,294,478 B1 | 9/2001 | Sakaguchi et al. |
| 6,303,468 B1 | 10/2001 | Aspar et al. |
| 6,306,720 B1 | 10/2001 | Ding |
| 6,310,387 B1 | 10/2001 | Seefeldt et al. |
| 6,316,333 B1 | 11/2001 | Bruel et al. |
| 6,323,108 B1 | 11/2001 | Kub et al. |
| 6,323,109 B1 | 11/2001 | Okonogi |
| 6,346,458 B1 | 2/2002 | Bower |
| 6,362,077 B1 | 3/2002 | Aspar et al. |

(56) References Cited

U.S. PATENT DOCUMENTS

| | | |
|---|---|---|
| 6,362,082 B1 | 3/2002 | Doyle et al. |
| 6,407,929 B1 | 6/2002 | Hale et al. |
| 6,417,075 B1 | 7/2002 | Haberger et al. |
| 6,429,094 B1 | 8/2002 | Maleville et al. |
| 6,429,104 B1 | 8/2002 | Auberton-Herve |
| 6,465,892 B1 | 10/2002 | Suga |
| 6,485,533 B1 | 11/2002 | Ishizaki et al. |
| 6,504,235 B2 | 1/2003 | Schmitz et al. |
| 6,513,564 B2 | 2/2003 | Bryan et al. |
| 6,529,646 B1 | 3/2003 | Wight et al. |
| 6,534,380 B1 | 3/2003 | Yamauchi et al. |
| 6,548,375 B1 | 4/2003 | De Los Santos et al. |
| 6,593,212 B1 | 7/2003 | Kub et al. |
| 6,596,569 B1 | 7/2003 | Bao et al. |
| 6,607,969 B1 | 8/2003 | Kub et al. |
| 6,632,082 B1 | 10/2003 | Smith |
| 6,645,831 B1 | 11/2003 | Shaheen et al. |
| 6,645,833 B2 | 11/2003 | Brendel |
| 6,653,207 B2 | 11/2003 | Ohya et al. |
| 6,727,549 B1 | 4/2004 | Doyle |
| 6,756,285 B1 | 6/2004 | Moriceau et al. |
| 6,756,286 B1 | 6/2004 | Moriceau et al. |
| 6,762,076 B2 | 7/2004 | Kim et al. |
| 6,764,936 B2 | 7/2004 | Daneman et al. |
| 6,770,507 B2 | 8/2004 | Abe et al. |
| 6,774,010 B2 | 8/2004 | Chu et al. |
| 6,809,009 B2 | 10/2004 | Aspar et al. |
| 6,828,214 B2 | 12/2004 | Notsu et al. |
| 6,846,690 B2 | 1/2005 | Farcy et al. |
| 6,887,769 B2 | 5/2005 | Kellar et al. |
| 6,893,936 B1 | 5/2005 | Chen et al. |
| 6,902,987 B1 | 6/2005 | Tong et al. |
| 6,927,147 B2 | 8/2005 | Fitzgerald et al. |
| 6,946,365 B2 | 9/2005 | Aspar et al. |
| 6,947,365 B2 | 9/2005 | Lai et al. |
| 6,974,759 B2 | 12/2005 | Moriceau et al. |
| 6,991,956 B2 | 1/2006 | Ghyselen et al. |
| 7,018,909 B2 | 3/2006 | Ghyselen et al. |
| 7,029,548 B2 | 4/2006 | Aspar et al. |
| 7,029,980 B2 | 4/2006 | Liu et al. |
| 7,052,978 B2 | 5/2006 | Shaheen et al. |
| 7,067,396 B2 | 6/2006 | Aspar et al. |
| 7,078,811 B2 | 7/2006 | Suga |
| RE39,484 E | 2/2007 | Bruel |
| 7,494,897 B2 | 2/2009 | Fournel et al. |
| 7,498,234 B2 | 3/2009 | Aspar et al. |
| 7,615,463 B2 | 11/2009 | Aspar et al. |
| 7,670,930 B2 | 3/2010 | Tauzin et al. |
| 7,713,369 B2 | 5/2010 | Aspar et al. |
| 7,772,087 B2 | 8/2010 | Nguyen et al. |
| 7,883,994 B2 | 2/2011 | Moriceau et al. |
| 7,902,038 B2 | 3/2011 | Aspar et al. |
| 8,241,996 B2 * | 8/2012 | Henley et al. .............. 438/458 |
| 2001/0007367 A1 | 7/2001 | Ohkubo |
| 2001/0007789 A1 | 7/2001 | Aspar et al. |
| 2002/0000646 A1 | 1/2002 | Gooch et al. |
| 2002/0001221 A1 | 1/2002 | Hashimoto |
| 2002/0025604 A1 | 2/2002 | Tiwari |
| 2002/0048948 A1 | 4/2002 | Gang |
| 2002/0081861 A1 | 6/2002 | Robinson et al. |
| 2002/0083387 A1 | 6/2002 | Miner et al. |
| 2002/0145489 A1 | 10/2002 | Cornett et al. |
| 2002/0153563 A1 | 10/2002 | Ogura |
| 2002/0185469 A1 | 12/2002 | Podlesnik et al. |
| 2002/0185684 A1 | 12/2002 | Campbell et al. |
| 2003/0077885 A1 | 4/2003 | Aspar et al. |
| 2003/0119279 A1 | 6/2003 | Enquist |
| 2003/0119280 A1 | 6/2003 | Lee et al. |
| 2003/0134488 A1 | 7/2003 | Yamazaki et al. |
| 2003/0134489 A1 | 7/2003 | Schwarzenbach et al. |
| 2003/0162367 A1 | 8/2003 | Roche |
| 2003/0199105 A1 | 10/2003 | Kub et al. |
| 2003/0234075 A1 | 12/2003 | Aspar et al. |
| 2004/0009649 A1 | 1/2004 | Kub et al. |
| 2004/0029358 A1 | 2/2004 | Park et al. |
| 2004/0067622 A1 * | 4/2004 | Akatsu et al. ............. 438/459 |
| 2004/0092087 A1 * | 5/2004 | Aspar et al. ............. 438/526 |
| 2004/0126708 A1 | 7/2004 | Jing et al. |
| 2004/0144487 A1 | 7/2004 | Martinez et al. |
| 2004/0150006 A1 | 8/2004 | Aulnetter et al. |
| 2004/0157409 A1 | 8/2004 | Ghyselen et al. |
| 2004/0171232 A1 | 9/2004 | Cayrefourcq et al. |
| 2004/0209441 A1 | 10/2004 | Maleville et al. |
| 2004/0222500 A1 | 11/2004 | Aspar et al. |
| 2004/0235266 A1 | 11/2004 | Tong |
| 2004/0262686 A1 | 12/2004 | Shaheen et al. |
| 2005/0029224 A1 | 2/2005 | Aspar et al. |
| 2005/0042842 A1 | 2/2005 | Lei et al. |
| 2005/0067377 A1 | 3/2005 | Lei et al. |
| 2005/0122845 A1 | 6/2005 | Lizzi |
| 2005/0148122 A1 | 7/2005 | Yonehara |
| 2005/0148163 A1 | 7/2005 | Nguyen et al. |
| 2005/0215071 A1 | 9/2005 | Moriceau et al. |
| 2005/0250294 A1 | 11/2005 | Ghyselen |
| 2005/0269671 A1 | 12/2005 | Faure et al. |
| 2006/0060943 A1 * | 3/2006 | Ben Mohamed et al. ..... 257/607 |
| 2006/0128117 A1 | 6/2006 | Ghyselen et al. |
| 2006/0191627 A1 | 8/2006 | Aspar et al. |
| 2006/0205179 A1 | 9/2006 | Fournel et al. |
| 2006/0252229 A1 | 11/2006 | Joly et al. |
| 2006/0255341 A1 * | 11/2006 | Pinnington et al. ............. 257/79 |
| 2006/0281212 A1 | 12/2006 | Moriceau et al. |
| 2007/0037363 A1 | 2/2007 | Aspar et al. |
| 2007/0277874 A1 * | 12/2007 | Dawson-Elli et al. ........ 136/256 |
| 2007/0281445 A1 | 12/2007 | Nguyen et al. |
| 2008/0254591 A1 | 10/2008 | Deguet et al. |
| 2009/0120568 A1 | 5/2009 | Deguet et al. |
| 2009/0130392 A1 | 5/2009 | Aspar et al. |
| 2009/0156016 A1 | 6/2009 | Di Cioccio |
| 2010/0112780 A1 * | 5/2010 | Thompson et al. ........... 438/458 |
| 2010/0167499 A1 | 7/2010 | Fournel et al. |
| 2010/0216294 A1 | 8/2010 | Rabarot et al. |
| 2010/0323497 A1 | 12/2010 | Fournel |

FOREIGN PATENT DOCUMENTS

| | | |
|---|---|---|
| EP | 0 383 391 A1 | 8/1990 |
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 895 282 A2 | 2/1999 |
| EP | 0 898 307 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 1 096 259 A1 | 5/2001 |
| EP | 0 717 437 B1 | 4/2002 |
| EP | 0 786 801 A1 | 6/2003 |
| EP | 0 767 486 B1 | 1/2004 |
| EP | 1 403 684 A1 | 3/2004 |
| EP | 0 925 888 B1 | 11/2004 |
| EP | 1 014 452 B1 | 5/2006 |
| FR | 2 671 472 A1 | 7/1992 |
| FR | 2 681 472 | 3/1993 |
| FR | 2 558 263 | 7/1995 |
| FR | 2 725 074 | 3/1996 |
| FR | 95 08882 | 6/1996 |
| FR | 2 736 934 | 1/1997 |
| FR | 2 748 850 A1 | 11/1997 |
| FR | 2 748 851 | 11/1997 |

(56) References Cited

FOREIGN PATENT DOCUMENTS

| | | |
|---|---|---|
| FR | 2 758 907 A1 | 7/1998 |
| FR | 2 767 416 A1 | 2/1999 |
| FR | 2 767 604 | 2/1999 |
| FR | 2 771 852 A1 | 6/1999 |
| FR | 2 773 261 | 7/1999 |
| FR | 2 774 510 A1 | 8/1999 |
| FR | 2 781 925 A1 | 2/2000 |
| FR | 2 789 518 A1 | 8/2000 |
| FR | 2 796 491 | 1/2001 |
| FR | 2 797 347 | 2/2001 |
| FR | 2 809 867 | 12/2001 |
| FR | 2 819 099 A1 | 7/2002 |
| FR | 2 847 075 A1 | 5/2004 |
| FR | 2 848 337 A1 | 6/2004 |
| FR | 2 861 497 | 4/2005 |
| GB | 2 211 991 A | 7/1989 |
| JP | 53-104156 | 9/1978 |
| JP | 58 31519 | 2/1983 |
| JP | 59-54217 | 3/1984 |
| JP | 61-129872 A | 6/1986 |
| JP | 62265717 | 11/1987 |
| JP | 101004013 | 1/1989 |
| JP | 01-128570 A | 5/1989 |
| JP | 01-169917 A | 7/1989 |
| JP | 08017777 | 1/1990 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11-233449 A | 8/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 02/84721 A1 | 10/2002 |
| WO | WO 02/84722 A1 | 10/2002 |
| WO | WO 03/013815 A1 | 2/2003 |
| WO | WO 03/021667 A2 | 3/2003 |
| WO | WO 03/032384 A1 | 4/2003 |
| WO | WO 03/063213 A2 | 7/2003 |
| WO | WO 04/001810 A2 | 12/2003 |
| WO | WO 2004/042779 A2 | 5/2004 |
| WO | WO 2004/044976 A1 | 5/2004 |
| WO | WO 2004/059711 A1 | 7/2004 |
| WO | WO 2004/061944 A1 | 7/2004 |
| WO | WO 2004/064146 A1 | 7/2004 |
| WO | WO 2005/000733 A2 | 1/2005 |
| WO | WO 2005/001915 A2 | 1/2005 |
| WO | WO 2005/013318 A2 | 2/2005 |
| WO | WO 2005/019094 A1 | 3/2005 |
| WO | WO 2005/043615 A1 | 5/2005 |
| WO | WO 2005/043616 A1 | 5/2005 |
| WO | WO 2007/020351 A1 | 2/2007 |
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

Notice of Service of Soitec's First Set of Interrogatories (Nos. 1-17) and Soitec's First Set of Requests for Production of Documents and Things (Nos. 1-132) by SOITEC Silicon on Insulator Technologies SA, Commissariat a LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon on Insulator Technologies SA, Commissariat a LEnergie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time.Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitecs Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a LEnergie Atomique. (Attachments: # 1 Certificate of Service) (Kraft, Denise) (Entered: May 29, 2009).
A. J. Auberton-Hervé, "Why Can Smart Cut® Change the Future of Microelectronics?," Published in International Journal of High Speed Electronics and Systems, vol. 10, No. 1 (2000) pp. 131-146.
Ayguavives et al., "Physical Properties of (Ba,Sr) $TiO_3$ Thin Films Used for Integrated Capacitors in Microwave Applications", IEEE 2001.
Caymax et al., High-Mobility Group-IV Materials and Devices, Materials Research Society, Symposium Proceedings, vol. 809, 2004.
Deguet, C. et al., "*200 MM Germanium-On-Insulator (GEOI) Structures Realized From Epitaxial Wafers Using the Smart Cut™ Technology*", ECS 2005, Quebec, vol. 2005-05, 11 pgs.
Di Cioccio, L. et al., "*Silicon Carbide on Insulator Formation by the Smart Cut® Process*".—Materials Science and Engineering B46 (1997)—(pp. 349-356).
Donohue et al., "Pulse-Extended Excimer Laser Annealing of Lead Zirconate Titanate Thin Films", Proceedings of the 12th International Symposium on Integrated Ferroelectrics, Aachen, Germany, Mar. 2000, *Integrated Ferroelectrics*, vol. 31, pp. 285 to 296, 2000.
Gomes, et al., "*Preparation of Silica-Based Hybrid Materials by Gamma Irradiation*"—Nuclear Instruments and Methods in Physics Research B 248, Jun. 2006, pp. 291-296.
Hartmann, et al., "Reduced pressure-chemical vapor deposition of intrinsic and doped Ge layers on Si(001) for microelectronics and optoelectronics purposes", Journal of Crystal growth 274, Jan. 2005, 90-99.
Heistand et al., "Advances in Passive Integration for C/RC Arrays & Networks with Novel Thin & Thick Film Materials", 36th Nordic IMAPS Conference, Helsinki, 1999.
Hendrix et al., "Low-Temperature Process for High-Density Thin-Film Integrated Capacitors", International Conference on High-Density Interconnect and Systems Packaging, 2000.

(56) References Cited

OTHER PUBLICATIONS

Huang, et al., Calculation of critical layer thickness considering thermal strain in $Si_{1-x}Ge_x$/Si strained-layer heterostructures, J. Appl. Phys. 83 (1), Jan. 1, 1998.

Jalaguier, E. et al., "*Transfer of Thin InP Films Onto Silicon Substrate by Proton Implantation Process*".—11$^{th}$ International Conference on Indium Phosphide and Related Materials May 16-20, 1999—Davos, Switzerland. (pp. 26-27).

Jalaguier, E. et al., "*Transfer of 3in GaAs Film on Silicon Substrate by Proton Implantation Process*". Feb. 1998, pp. 408-409.

Jenei et al., "High-Q Inductors and Capacitors on Si Substrate", IEEE 2001.

Kim et al., "A Porous-Si-based Novel Isolation Technology for Mixed-Signal Integrated Circuits", Symposium on VLSI Technology, 2000.

Letertre F. et al., "*Germanium-On-Insulator (GeOI) Structure Realized by the Smart Cut™ Technology*".—Mat. Res. Soc. Symp. Pros vol. 809 © 2004 Materials Research Society. (pp. 153-158).

Liu et al., "Integrated Thin Film Capacitor Arrays", International Conference on High Density Packaging and MCMs, 1999.

Motohiro et al. "*Geometrical Factors of Argon Incorporation in $SiO_2$ Films Deposited by ION Beam Sputtering*"—Thin Solid Films, Elsevier-Sequoia S.A. Lausanne, CH, vol. 120, No. 4—Oct. 1, 1984, pp. 313-327.

Ray et al. "*Effect of Reactive-Ion Bombardment on the Properties of Silicon Nitride and Oxynitride Films Deposited by Ion-Beam Sputtering*"—Journal of Applied Physics, vol. 75, No. 12, Jun. 15, 1994—pp. 8145-8152.

Tillman et al., "Zero-Level Packaging for MEMS or MST Devices: The IRS Method", MEMS/Sensors, Advancing Microelectronics, pp. 37-39, Nov./Dec. 2000.

Tomisaka et al., "Electroplating Cu Fillings for Through-Vias for Three-Dimensional Chip Stacking" (Electronic Components and Technology Conference, Aug. 2002).

Wu, et al. "*Effect of the Working Gas of the Ion-Assisted Source on the Optical and Mechanical Properties of SI02 Films Deposited by Dual Ion Beam Sputtering with SI and SI02 as the Starting Materials*"—Applied Optics, OSA, Optical Society of America Washington, DC., vol. 45, No. 15, May 20, 2006—pp. 3510-3515.

International Search Report for International Application No. PCT/FR1998/002904, dated Apr. 16, 1999, 2 pages.

International Search Report for International Application No. PCT/FR2002/001266, dated Feb. 7, 2003, 4 pages.

International Search Report for International Application No. PCT/FR2002/001268, dated Feb. 6, 2003, 4 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/001565, dated Jul. 6, 2005, 3 pages.

International Search Report for International Application No. PCT/FR2006/001945, dated Jan. 8, 2007, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 10/577,175, dated Apr. 13, 2010, 14 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/561,299, dated Mar. 26, 2008, 9 pages.

Office Action from U.S. Appl. No. 10/561,299, dated Dec. 9, 2008, 11 pages.

Office Action from U.S. Appl. No. 10/561,299, dated May 11, 2009, 12 pages.

Office Action from U.S. Appl. No. 10/561,299, dated Nov. 16, 2009, 11 pages.

Office Action from U.S. Appl. No. 10/561,299, dated Nov. 27, 2009, 10 pages.

Office Action from U.S. Appl. No. 10/561,299, dated May 11, 2010, 11 pages.

Office Action from U.S. Appl. No. 10/565,621, dated May 15, 2007, 13 pages.

Office Action from U.S. Appl. No. 10/565,621, dated Feb. 11, 2008, 11 pages.

Office Action from U.S. Appl. No. 10/565,621, dated Sep. 12, 2008, 9 pages.

Office Action from U.S. Appl. No. 10/565,621, dated Mar. 12, 2009, 6 pages.

Office Action from U.S. Appl. No. 10/565,621, dated Jan. 7, 2010, 8 pages.

Office Action from U.S. Appl. No. 10/565,621, dated Nov. 23, 2010, 11 pages.

Office Action from U.S. Appl. No. 12/628,772, dated Oct. 7, 2010, 12 pages.

Office Action from U.S. Appl. No. 12/682,522, dated Mar. 29, 2011, 10 pages.

Notice of Allowance from U.S. Appl. No. 12/336,229, dated Sep. 29, 2010, 7 pages.

Notice of Allowance from U.S. Appl. No. 12/336,229, dated Jan. 10, 2011, 4 pages.

Office Action from U.S. Appl. No. 10/468,223, dated Oct. 5, 2005, 7 pages.

Office Action from U.S. Appl. No. 10/468,223, dated May 3, 2006, 11 pages.

Office Action from U.S. Appl. No. 10/468,223, dated Jan. 10, 2007, 11 pages.

Office Action from U.S. Appl. No. 10/468,223, dated Jul. 20, 2007, 11 pages.

Office Action from U.S. Appl. No. 10/468,223, dated Feb. 11, 2008, 11 pages.

Office Action from U.S. Appl. No. 10/468,223, dated Oct. 29, 2008, 11 pages.

Office Action from U.S. Appl. No. 10/468,223, dated Jun. 25, 2009, 8 pages.

Notice of Allowance from U.S. Appl. No. 10/468,223, dated Dec. 28, 2009, 4 pages.

Office Action from U.S. Appl. No. 10/474,984, dated Mar. 11, 2010, 13 pages.

Notice of Allowance from U.S. Appl. No. 10/474,984, dated Oct. 28, 2010, 6 pages.

Office Action from U.S. Appl. No. 10/540,303, dated Dec. 18, 2007, 6 pages.

(56) References Cited

OTHER PUBLICATIONS

Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No.11/327,906, dated Sep. 15, 2008, 6 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 8, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. and Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. and Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant-Cross Appellant's Response to Appellants' Submission of *CFMT, Inc.* v. *Yieldup Int'l*, [dated Nov. 24, 2003].
Decision from the United States Court of Appeals for the Federal Circuit dated Nov. 26, 2003.
Combined Petition for Panel Rehearing and for Rehearing En Banc by Plaintiffs-Appellant's Soitec, S.A. and Commissariat A L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Cross Motion to Bifurcate all Collateral Issues—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate all Collateral Issues, 77 Motion to Bifurcate the Issues of Willfulness and Damages for Purposes of Discovery and Trial and proposed Form of Order filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 Motion to Bifurcate the Issues of Willfulness and Damages for Purposes of Discovery and Trial and proposed Form of Order filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate all Collateral Issues filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate all Collateral Issues filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Motion for Leave to File Stipulated Motion for Leave to File a Sur-Reply Brief in Support of MEMC's Motion to Bifurcate—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction

(56) References Cited

OTHER PUBLICATIONS for U.S. Patent No. 7,067,396—filed by MEMC Electronic Materials Inc.. (Rogowski, Patricia) (Entered: May 7, 2010).
Opening Brief in Support re 141 Motion for Discovery Motion for the Admission of the Expert Testimony of John T. Goolkasian Relating to the Certificate of Correction for U.S. Patent No. 7,067,396 filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian filed SOITEC Silicon On Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, Declaration of Marcus T. Hall in Support of Plaintiff's Answering Brief in Opposition to Defendant's Motion for the Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation Joint Claim Construction Statement by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Sur-Reply Brief re 141 Motion for Discovery for the Admission of the Expert Testimony of John T. Goolkasian relating to the certificate of correction for U.S. Patent No. 7,067,396 Surreply by Plaintiffs to Motion by Defendant for the Admission of Expert Testimony of John T. Goolkasian filed by SOITEC Silicon On Insulator Technologies SA. (Attachments: #1 Certificate of Service)(Kraft, Denise) (Entered: Jun. 15, 2010).
Declaration re 157 Sur-Reply Brief, Declaration of Marcus T. Hall in Support of Surreply by Plaintiffs to Motion by Defendant for the Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief Plaintiffs S.O.I.TEC Silicon on Insulator Technologies, S.A. and Commissariat a L'Energie Atomique's Opening Claim Construction Brief filed by Commissariat a LEnergie Atomique, SOITEC Silicon on Insulator Technologies SA. (Attachments: # 1 Certificate of Service)(Kraft, Denise) (Entered: Jun. 25, 2010).
Declaration re 168 Claim Construction Opening Brief, Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0352, # 11 Appendix DA-0353-DA-0392, # 12 Appendix DA-0393-DA-0432, # 13 Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, #11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I—JA0001 to JA0533. Appendix vol. I re 173 Notice of filing Paper Documents(Oversized Document, Item on File in the Clerks Office).(lid) (Entered: Jun. 28, 2010).
Notice of filing the following document(s) in paper format: Joint Appendix of Exhibits to Opening and Answering Claim Construction Briefs (2) vol. II—JA0534 to JA0930. Appendix vol. II re 173 Notice of Filing Paper Documents(Oversized Document, Item on File in the Clerks Office). (lid) Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV—JA1503 to JA1510. Appendix vol. IV. re 173

(56) References Cited

OTHER PUBLICATIONS

Notice of Filing Paper Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
Vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).
Motion in Limine SOITEC/CEA Parties' Motion to Exclude the Expert Report of Dr. Pascal Bellon and Any Related Testimony—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment of Invalidity of the Asserted Aspar Patent Claims—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine SOITEC/CEA Parties' Motion to Exclude the Expert Report of Dr. Pascal Bellon and Any Related Testimony filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment of Invalidity of the Asserted Aspar Patent Claims filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine SOITEC/CEA Parties' Motion to Exclude the Expert Report of Dr. Pascal Bellon and Any Related Testimony Plaintiffs' Omnibus Appendix to Daubert Motion and Motions for Partial Summary Judgment Filed on Jul. 2, 2010 by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment of Non-Infringement—filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment SOITEC/CEA Parties Motion for Partial Summary Judgment That the Patents in Suit Satisfy the Written Description Requirement—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 MOTION for Partial Summary Judgment SOITEC/CEA Parties Motion for Partial Summary Judgment that the Patents in Suit Satisfy the Written Description Requirement filed by Commissariat a LEnergie Atomique, SOITEC Silicon On Insulator Technologies SA, SOITEC U.S.A., Inc..Answering Brief/Response due date per Local Rules is Jul. 19, 2010. (Attachments # 1 Certificate of Service)(Kraft, Denise) (Entered: Jul. 2, 2010).
Motion for Partial Summary Judgment Plaintiffs' Motion for Partial Summary Judgment That the Certificate of Correction for the '396 Patent is Valid—filed by Commissariat a LEnergie Atomique, SOITEC Silicon on Insulator Technologies SA. (Attachments: # 1 Certificate of Service)(Kraft, Denise) (Entered: Jul. 2, 2010).

Opening Brief in Support re 204 Motion for Partial Summary Judgment Plaintiffs' Motion for Partial Summary Judgment That the Certificate of Correction for the '396 Patent is Valid filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC/CEA Parties' Motion for Partial Summary Judgment That the Aspar Patents Are Not Invalid for Inequitable Conduct—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment SOITEC/CEA Parties' Motion for Partial Summary Judgment That the Aspar Patents Are Not Invalid for Inequitable Conduct filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment Plaintiffs' Motion for Partial Summary Judgment That the Bruel Patent Does Not Anticipate the Aspar Patents—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment Plaintiffs' Motion for Partial Summary Judgment That the Bruel Patent Does Not Anticipate the Aspar Patents filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion for Partial Summary Judgment of Invalidity of United States Patent No. 5,834,812 for Lack of Enablement—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment SOITEC's Motion for Partial Summary Judgment of Invalidity of United States Patent No. 5,834,812 for Lack of Enablement filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion for Partial Summary Judgment for Invalidity of Asserted Claims of United States Patent No. 5,834,812 in View of Prior Art—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment That the Best Mode Requirement is Satisfied for the Claims of the '009 and '396 Patents—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment SOITEC's Motion for Partial Summary Judgment for Invalidity of Asserted Claims of United States Patent No. 5,834,812 in View of Prior Art filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment That the Best Mode Requirement is Satisfied for the Claims of the '009 and '396 Patents filed by SOITEC Silicon on Insulator Technologies SA.Answering Brief/Response due date per Local Rules is Jul. 19, 2010. (Attachments: # 1 Certificate of Service)(Reed, John) (Entered: Jul. 2, 2010).
Redacted Version of 200 Opening Brief in Support, by MEMC Electronic Materials Inc.. (Attachments: # 1 Certificate of Service)(Rogowski, Patricia) (Entered: Jul. 7, 2010).

(56) References Cited

OTHER PUBLICATIONS

Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).

Redacted Version of 190 Appendix by MEMC Electronic Materials Inc.. (Attachments: # 1 Appendix MA0484-MA0489, # 2 Appendix MA0490-MA0515, # 3 Appendix MA0516-MA0534, # Appendix 4 MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630,# 19 Appendix MA0631-MA0653,# 20 Appendix MA0654-MA0685, # 21 Appendix MA0686-MA0701, # 22 Appendix MA0702-MA0732, #23 Appendix MA0733-MA0742, #24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # Appendix MA0885-MA0887, # 38 Appendix MA0887-MA0891, # 39 Appendix MA0892-MA0909, # 40 Appendix MA0910-MA0931, # 41 Certificate of Service)(Rogowski, Patricia) (Entered: Jul. 7, 2010).

Redacted Version of 198 Opening Brief in Support,, SOITEC/CEA Parties' Opening Brief In Support of Motion For Summary Judgement: Non-Infrigement by Commissariat a LEnergie Atomique, SOITEC Silicon On Insulator Technologies SA, SOITEC U.S.A., Inc.. (Kraft, Denise) (Entered: Jul. 8, 2010).

Redacted Version of 197 Sealed Motion for Summary Judgment SOITEC/CEA Parties' Motion for Summary Judgment: Non-Infringement (Filed Under Seal)Sealed Motion for Summary Judgment SOITEC/CEA Parties' Motion for Summary Judgment: Non-Infringement (Filed Under Seal) SOITEC/CEA Parties' Motion for Summary Judgment: Non-Infringement by Commissariat a LEnergie Atomique, SOITEC Silicon on Insulator Technologies SA, SOITEC U.S.A., Inc.. (Kraft, Denise) (Entered: Jul. 8, 2010).

Redacted Version of 192 Appendix, Plaintiffs' Omnibus Appendix to Daubert Motion and Motions for Partial Summary Judgment Filed on Jul. 2, 2010—vol. VI of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 193 Appendix, Plaintiffs' Omnibus Appendix to Daubert Motion and Motions for Partial Summary Judgment Filed on Jul. 2, 2010—vol. VIII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 194 Appendix, Plaintiffs' Omnibus Appendix to Daubert Motion and Motions for Partial Summary Judgment Filed on Jul. 2, 2010—vol. X of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 195 Appendix, Plaintiffs' Omnibus Appendix to Daubert Motion and Motions for Partial Summary Judgment filed on Jul. 2, 2010—vol. XVII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 196 Appendix, Plaintiffs' Omnibus Appendix to Daubert Motion and Motions for Partial Summary Judgment filed on Jul. 2, 2010—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).

Appendix re 228 Claim Construction Answering Brief by MEMC Electronic Materials Inc.. (Attachment: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Serive)(Rogowski, Patrica) (Entered: Jul. 9, 2010).

Claim Construction Answering Brief re 168 Claim Construction Opening Brief, 228 Claim Construction Answering Brief Plaintiffs S.O.I.TEC on Insulator Technologies, S.A. and Commissariat a Energie Atomique's Answering Claim Construction Brief filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).

Appendix re 230 Claim Construction Answering Brief, Appendix to Plaintiffs S.O.I.TEC on Insulator Technologies, S.A. and Commissariat a Energie Atomique's Answering Claim Construction Brief by Commissariat a LEnergie Atomique, SOITEC Silicon on Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).

Redacted Version of 183 Appendix, Joint Appendix of Exhibits to Opening and Answering Claim Construction Briefs vol. IV of VI by Commissariat a LEnergie Atomique, SOITEC Silicon on Insulator Technologies SA. (Kraft, Denise) (Entered: Jul. 12, 2010).

Redacted Version of 170 Exhibit to a Document, Exhibit A to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Kraft, Denise) (Entered: Jul. 12, 2010).

Redacted Version of 171 Exhibit to a Document, Exhibit B to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Kraft, Denise) (Entered: Jul. 12, 2010).

Redacted Version of 172 Exhibit to a Document, Exhibit C to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Kraft, Denise) (Entered: Jul. 12, 2010).

Answering Brief in Opposition re 186 Motion in Limine SOIEC/CEA Parties' Motion to Exclude the Expert Report of Dr. Pascal Bellon and Any Related Testimony filed by MEMC Electronic Materials Inc..Reply Brief due date per Local Rules is Jul. 29, 2010. (Rogowski, Patricia) (Entered: Jul. 19, 2010).

Answering Brief in Opposition re 208 Motion for Partial Summary Judgment Plaintiffs' Motion for Partial Summary Judgment That the Bruel Patent Does Not Anticipate the Aspar Patents filed by MEMC Electronic Materials Inc..Reply Brief due date per Local Rules is Jul. 29, 2010. (Rogowski, Patricia) (Entered: Jul. 19, 2010).

Answering Brief in Opposition re 202 Motion for Partial Summary Judgment SOITEC/CEA Parties Motion for Partial Summary Judgment That the Patents in Suit Satisfy the Written Description Require-

(56) References Cited

OTHER PUBLICATIONS ment filed by MEMC Electronic Materials Inc..Reply Brief due date per Local Rules is Jul. 29, 2010. (Rogowski, Patricia) (Entered: Jul. 19, 2010).
Answering Brief in Opposition re 204 Motion for Partial Summary Judgment Plaintiffs' Motion for Partial Summary Judgment that the Certificate of Correction for the '396 Patent is Valid filed by MEMC Electronic Materials Inc..Reply Brief due date per Local Rules is Jul. 29, 2010. (Rogowski, Patricia) (Entered: Jul. 19, 2010).
Answering Brief in Opposition re 210 Motion for Partial Summary Judgment SOITEC's Motion for Partial Summary Judgment of Invalidity of United States Patent No. 5,834,812 for Lack of Enablement filed by MEMC Electronic Materials Inc..Reply Brief due date per Local Rules is Jul. 29, 2010 (Rogowski, Patricia) (Entered: Jul. 19, 2010).
Answering Brief in Opposition re 212 Motion for Partial Summary Judgment SOITEC's Motion for Partial Summary Judgment for Invalidity of Asserted Claims of United States Patent No. 5,834,812 in View of Prior Art filed by MEMC Electronic Materials Inc..Reply Brief due date per Local Rules is Jul. 29, 2010. (Rogowski, Patricia) (Entered: Jul. 19, 2010).
Appendix re 247 Answering Brief in Opposition,, Appendix to Plaintiffs' Answering Brief in Opposition to Defendant's Motion for Partial Summary Judgment of Invalidity of the Asserted Aspar Claims (PA-1103-PA-1156) by Commissariat a LEnergie Atomique, SOITEC Silicon On Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).
Appendix re 250 Answering Brief in Opposition, Appendix to Plaintiffs' Answering Brief in Opposition to Defendant's Motion for Summary Judgment of Non-Infringement by Commissariat a LEnergie Atomique, SOITEC Silicon On Insulator Technologies SA. (Attachments: # 1 Exhibit PA-1190-PA-1191, # 2 Certificate of Service)(Kraft, Denise) (Entered: Jul. 19, 2010).
Redacted Version of 241 Answering Brief in Opposition, to Plaintiffs' Motion for Partial Summary Judgment that the Best Mode Requirement is Satisfied for the Claims of the '009 and '396 Patents by MEMC Electronic Materials Inc.. (Rogowski, Patricia) (Entered: Jul. 26, 2010).
Redacted Version of 249 Answering Brief in Opposition, to Plaintiffs' Motion for Summary Judgment on the Infringement of U.S. Patent No. 5,834,812 by MEMC Electronic Materials Inc.. (Rogowski, Patricia) (Entered: Jul. 26, 2010).
Redacted Version of 253 Answering Brief in Opposition, to Plaintiffs' Motion for Partial Summary Judgment that the Aspar Patents Are Not Invalid for Inequitable Conduct by MEMC Electronic Materials Inc. (Rogowski, Patricia) (Entered: Jul. 26, 2010).
Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).
Redacted Version of 261 Answering Brief in Opposition, to Plaintiffs' Motion for Partial Summary Judgment that the Best Mode Requirement is Satisfied for the Claims of the '009 and '396 Patents (Corrected Version of D.I. 241) by MEMC Electronic Materials Inc.. (Rogowski, Patricia) (Entered: Jul. 26, 2010).
Redacted Version of 250 Answering Brief in Opposition, to Soitec's Brief in Opposition to Defendant's Motion for Summary Judgment of Non-Infringement by Commissariat a LEnergie Atomique, SOITEC Silicon On Insulator Technologies SA. (Attachments: # 1 Certificate of Service)(Kraft, Denise) (Entered: Jul. 26, 2010).
Redacted Version of 247 Answering Brief in Opposition,, to Plaintiffs' Answering Brief In Opposition to Defendant's Motion For Partial Summary Judgment of In validity of the Asserted Aspar Claims by Commissariat a LEnergie Atomique, SOITEC Silicon On Insulator Technologies SA. (Attachments: # 1 Certificate of Service)(Kraft, Denise) (Entered: Jul. 26, 2010).
Redacted Version of 254 Appendix,, to Appendix to Plaintiffs' Answering Brief in Opposition to Defendant's Motion for Partial Summary Judgment of Invalidity of the Asserted Aspar Claims (PA-1103-PA-1143 by Commissariat a LEnergie Atomique, SOITEC Silicon on Insulator Technologies SA. (Kraft, Denise) (Entered: Jul. 26, 2010).
Redacted Version of 251 Appendix to Appendix to Plaintiffs' Answering Brief in Opposition to Defendant's Motion for Summary Judgment of Non-Infringement by Commissariat a LEnergie Atomique, SOITEC Silicon on Insulator Technologies SA. (Kraft, Denise) (Entered: Jul. 26, 2010).
Reply Brief re 204 Motion for Partial Summary Judgment Plaintiffs' Motion forPartial Summary Judgment that the Certificate of Correction for the '396 Patent is Valid Reply Brief in Support of Plaintiffs' Motion for Partial Summary Judgment that the Certificate of Correction for the '396 Patent is Valid filed by Commissariat a LEnergie Atomique, SOITEC Silicon on Insulator Technologies SA. (Attachments: # 1 Certificate of Service)(Kraft, Denise) (Entered: Jul. 30, 2010).
Declaration re 268 Reply Brief, Declaration of Marcus T. Hall in Support of Reply Brief in Support of Plaintiffs' Motion for Partial Summary Judgment That the Certificate of Correction for the '396 Patent is Valid by Commissariat a LEnergie Atomique, SOITEC Silicon On Insulator Technologies SA. (Attachments: # 1 Exhibit A, # 2 Certificate of Service)(Kraft, Denise) (Entered: Jul. 30, 2010).
Appendix re 268 Reply Brief, Omnibus Appendix to Plaintiffs' Reply Briefs in Support of Plaintiffs' Daubert Motion and Motions for PArtial Summary Judgment (PA-1192-PA1261) by Commissariat a LEnergie Atomique, SOITEC Silicon On Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Reply Brief re 210 Motion for Partial Summary Judgment SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement filed by SOITEC Silicon on Insulator Technologies SA, SOITEC U.S.A., Inc.. (Attachments: # 1 Certificate of Service)(Kraft, Denise) (Entered: Jul. 30, 2010).
Reply Brief re 212 Motion for Partial Summary Judgment SOITEC's Motion for Partial Summary Judgment for Invalidity of Asserted Claims of United States Patent No. 5,834,812 in View of Prior Art Reply Brief in Support of SOITEC's Motion for Partial Summary Judgment for Invalidity of Asserted Claims of United States Patent No. 5,834,812 in View of Prior Art filed by SOITEC Silicon on Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Brief re 202 Motion for Partial Summary Judgment SOITEC/CEA Parties Judgment That the Patents in Suit Satisfy the Written Description Requirement Reply Brief in Support of SOITEC/CEA Parties' Motion for Partial Summary Judgment That the Patents in Suit Satisfy the Written Description Requirement filed by Commissariat a LEnergie Atomique, SOITEC Silicon on Insulator Technologies SA. (Attachments: # 1 Certificate of Service)(Kraft, Denise) (Entered: Jul. 30, 2010).
Redacted Version of 269 Appendix, to Reply Brief in Support of MEMC's Motion for Partial Summary Judgment of Invalidity of the Asserted Aspar Patent Claims by MEMC Electronics Materials Inc..

(56) References Cited

OTHER PUBLICATIONS (Attachment: # 1 Appendix Table of Contents, # 2 Appendix MA2453_MA2479, # 3 Certificate of Service)(Rogowski, Patricia) (Entered: Aug. 3, 2010).
Redacted Version of 273 Appendix Reply Brief in Support of MEMC's Motion for Summary Judgment of Non-Infringement by MEMC Electronic Materials Inc.. (Attachments: # 1 Appendix Table of Contents, # 2 Appendix MA2352-MA2361, # 3 Appendix MA2363-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430,# 12 Appendix MA2431-MA2440, —Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010.
Redacted Version of 267 Reply Brief in Support of MEMC's Motion for Partial Summary Judgment of Invalidity of the Asserted Aspar Patent Claims by MEMC Electronic Materials Inc.. (Rogowski, Patricia) (Entered: Aug. 3, 2010).
Redacted Version of 271 Reply Brief in Support of MEMC's Motion for Summary Judgment of Non-Infringement by MEMC Electronic Materials Inc.. (Rogowski, Patricia) (Entered: Aug. 3, 2010).
Redacted Version of 274 Appendix,, Omnibus Appendix to Plaintiffs' Reply Briefs in Support of Plaintiffs' Daubert Motion and Motions for Partial Summary Judgment (PA-1192-PA-1198 and PA-1207-PA-1230 Filed Under Seal) by Commissariat a LEnergie Atomique, SOITEC Silicon on Insulator Technologies SA. (Kraft, Denise) (Entered: Aug. 6, 2010).
Redacted Version of 277 Reply Brief, in Support of SOITEC/CEA Parties' Motion to Exclude the Expert Report of Dr. Pascal Bellon and Any Related Testimony by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion for Summary Judgment: Non-Infringement (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 279 Reply Brief,, in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 281 Reply Brief, in Support of Plaintiffs' Motion For Partial Summary Judgment that the Bruel Patent Does Not Anticipate the Aspar Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion For Partial Summary Judgment That the Aspar Patents Are Not Invalid For Inequitable Conduct (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001-FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).

Redacted Version of 303 Exhibit to a Document Exhibit A to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon on Insulator Technologies SA, Soitec U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon on Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon On Insulator Technologies SA, SOITEC U.S.A. Inc.. (Attachment: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be

(56) References Cited

OTHER PUBLICATIONS stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Jugdment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).
Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon on Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon on Insulator Technologies SA, Soitec U.S.A., Inc.. (Kraft, Denise) (Entered: Oct. 21, 2010).
Letter to the Honorable Sue L. Robinson from Denise Seastone Kraft regarding Mutually agreed upon narrowing of the issues for trial—re 333 Stipulation, 332 Stipulation,. (Kraft Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon on Insulator Technologies SA, SOITEC U.S.A. Inc., Commissariat a LEnergie Atomique, 332 Stipulation, filed by SOITEC Silicon on Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff'S Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC's Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of No Unenforceability of the '009 Patent Due to Inequitable Conduct submitted at trial by Commissariat a LEnergie Atomique, SOITEC Silicon on Insulator Technologies SA, SOITEC U.S.A., Inc.. (Attachments: #1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. and against plaintiffs S.O.I.TEC Silicon on Insulator Technologies, S.A. and Commisseriat a LEnergie Atomique et aux Energies Alternatives as to the 812 patent. It Is Further Ordered that judgment be and is hereby entered in favor of plaintiffs S.O.I.TEC Silicon on Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Material Inc., SOITEC Silicon On Insulator Technologies SA. (Rogowski, Patricia) (Entered: Nov. 15, 2010).
Motion for Reargument re 348 Judgment,, (MEMCS Motion for reargument of the Courts Order Re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiffs Motion for Reargument—filed by Commissariat a LEnergie Atomique, SOITEC Silicon on Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon on Insulator Technologies SA, SOITEC U.S.A., Inc..

(56) References Cited

OTHER PUBLICATIONS (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon on Insulator Technologies SA, SOITEC U.S.A., Inc.. (Kraft, Denise) (Entered: Dec. 3, 2010).
Reply Brief re 350 Motion for Reargument re 348 Judgment,, (MEMCS Motion for Reargument of the Courts Order Re: The Unenforceability of the 009 Patent) Plaintiffs' Opposition to MEMC's Motion for Reargument of the Court's Order Re: The Unenforceability of the '009 Patent filed by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon on Insulator Technologies SA, SOITEC U.S.A., Inc.. (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon on Insulator Technologies SA, Soitec U.S.A., Inc.. (Kraft, Denise) (Entered: Dec. 13, 2010).
Motion for Judgment as a Matter of Law—MEMC's Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).
Motion for Judgment as a Matter of Law Plaintiffs' Renewed Motion for Judgment As a Matter of Law or in the Alternative for a New Trial—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion for Judgment as a Matter of Law or in the Alternative for a New Trial filed by Commissariat a LEnergie Atomique, SOITEC Silicon on Insulator Technologies SA.Answering Brief/Response due date per Local Rules is Jan. 3, 2011. (Attachments: # 1 Certificate of Service)(Kraft, Denise) (Entered: Dec. 14, 2010).
Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).
Stipulation to Extend Time Post-Trial Answering Briefs to Jan. 12, 2011—filed by MEMC Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon on Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 MOTION for Judgment as a Matter of Law—MEMC's Renewed Motion for Judgment as a Matter of Law or in the Alternative for a New Trial filed by Commissariat a LEnergie Atomique, SOITEC Silicon on Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition re 361 Motion for Judgment as a Matter of Law Plaintiffs' Renewed Motion for Judgment as a Matter of Law or in the Alternative for a new Trial (MEMCS Answering Brief in Opposition to Plaintiffs renewed Motion for Judgment as a Matter of Law or in the Alternative for a New Trial) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (Declaration of Robert M. Evans, Jr. In Support of MEMCS Opposition to Plaintiffs Renewed Motion for Judgment As a Matter of Law or in the Alternative for a New Trial) by MEMC Electronic Materials Inc.. (Attachments: # 1 Exhibit 1, # 2 Exhibit 2, # 3 Certificate of Service)(Rogowski, Patricia) (Entered: Jan. 14, 2011).
Redacted Version of 376 Answering Brief in Opposition, to Plaintiffs' Motion for Injunctive Relief and to Lift Stay on Damages Discovery by MEMC Electronic Materials Inc.. (Attachments: # 1 Certificate of Service)(Rogowski, Patricia) (Entered: Jan. 20, 2011).
Redacted Version of 377 Appendix to MEMC's Answering Brief in Opposition to Plaintiffs' Motion for Injunctive Relief and to Lift Stay on Damages Discovery by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Service)(Rogowski, Patricia) (Entered: Jan. 20, 2011).
Joint Stipulation to Extend Time of Post-Trial Reply Briefs to Tuesday, Feb. 1, 2011—filed by Commissariat a LEnergie Atomique, SOITEC Silicon on Insulator Technologies SA, SOITEC U.S.A., Inc.. (Kraft, Denise) (Entered: Jan. 28, 2011).
Joint Stipulation to Extend Time of Post-Trial Reply Briefs to Friday, Feb. 4, 2011—filed by Commissariat a LEnergie Atomique, SOITEC Silicon on Insulator Technologies SA, SOITEC U.S.A., Inc.. (Kraft, Denise) (Entered: Jan. 31, 2011).
Redacted Version of 364 Opening Brief in Support,,,, Redacted Version of Opening Brief in Support of Plaintiffs' Motion for Injunctive Relief and to Lift Stay on Damages Discovery by Commissariat a LEnergie Atomique, SOITEC Silicon on Insulator Technologies SA, SOITEC U.S.A., Inc.. (Attachments: # 1 Exhibits A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit O, # Exhibit P, # 17 Exhibit Q, # 18 Exhibit R, # 19 Exhibit S)(Kraft, Denise) (Entered: Feb. 2, 2011).
Reply Brief re 359 Motion for Judgment as a Matter of Law—MEMC's Renewed Motion for Judgment as a Matter of Law or in the Alternative for a New Trial filed by MEMC Electronic Materials Inc.. (Attachments: # 1 Certificate of Service)(Rogowski, Patricia) (Entered: Feb. 4, 2011).
Reply Brief re 361 MOTION for Judgment as a Matter of Law Plaintiffs' Renewed Motion for Judgment as a Matter of Law or in the Alternative for a New Trial filed by Commissariat LEnergie

(56) References Cited

OTHER PUBLICATIONS

Atomique, SOITEC Silicon on Insulator Technologies SA, SOITEC U.S.A., Inc.. (Attachments: # 1 Certificate of Service)(Kraft, Denise) (Entered: Feb. 4, 2011).
Declaration re 387 Reply Brief, Declaration of Michael L. Brody in Support of Reply Brief In Support of Plaintiffs' Renewed Motion for Judgment as a Matter of Law or In the Alternative For a New Trial by Commissariat a LEnergie Atomique, SOITEC Silicon on Insulator Technologies SA, SOITEC U.S.A., Inc.. (Attachment: # 1 Exhibit A, # 2 Certificate of Service)(Kraft, Denise) (Entered: Feb. 4, 2011).
Motion to Strike 386 Reply Brief, Motion by Plaintiffs' to Strike Reply Brief in Support of MEMC's Renewed Motion for Judgment as a Matter of Law or, in the Alternative, a New Trial (D.I. 386)—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 8, 2011).
Opening Brief in Support re 390 Motion to Strike 386 Reply Brief, Motion By Plaintiffs' to Strike Reply Brief in Support of MEMC's Renewed Motion for Judgment as a Matter of Law or, in the Alternative, a New Trial (D.I. 386) Motion to Strike 386 Reply Brief, Motion By Plaintiffs' to Strike Reply Brief in Support of MEMC's Renewed Motion for Judgment as a Matter of Law or, in the Alternative, a New Trial (D.I. 386) filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).
Declaration re 391 Opening Brief in Support,, Declaration of Marcus T. Hall in Support in Plaintiffs' Opening Brief in Support of Motion to Strike Reply Brief in Support of MEMC's Renewed Motion for Judgment as a Matter of Law or, in the Alternative, a New Trial (D.I. 386) by Commissariat a LEnergie Atomique, SOITEC Silicon On Insulator Technologies SA, SOITEC U.S.A., Inc., (Attachments: #1 Exhibit A, #2 Certificate of Service)(Kraft, Denise) (Entered: Feb. 8, 2011).
Redacted Version of 389 Reply Brief, Redacted Version of Reply Brief in Support of Plaintiffs' Motion for Injuctive Relief and the Lift Stay on Damages Discovery by Commissariat a LEnergie Atomique, SOITEC Silicon On Insulator Technologies SA, SOITEC U.S.A., Inc.. (Kraft, Denise)(Entered: Feb. 9, 2011).
Answering Brief in Opposition to 390 Motion to Strike 386 Reply Brief, Motion by Plaintiffs' to Strike Reply Brief in Support of MEMC's Renewed Motion for Judgement as a Matter of Law or, in the Alternative, a New Trial (D.I. 386) Motion to Strike 386 Reply Brief, Motion by Plaintiffs' to Strike Reply Brief in Support of MEMC's Renewed Motion for Judgement as a Matter of Law or, in the Alternative, a New Trial (D.I. 386) filed by MEMC Electronic Materials Inc..Reply brief due date per Local Rules is Feb. 28, 2011. (Attachments: #1 Exhibit 1-3, #2 Certificate of Service)(Rogowski, Patricia) (Entered: Feb. 8, 2011).
Reply Brief re 390 Motion to Strike 386 Brief, Motion By Plaintiffs' to Strike Reply Brief In Support of MEMC's Renewed Motion For Judgment as a Matter of Law or, In The Alternative, a New Trial (D.I. 386) Motion to Strike 386 Reply Brief, Motion By Plaintiffs' to Strike Reply In Support of MEMC's Renewed Motion for Judgment as a Matter of Law or, In the Alternative, a New Trial (D.I. 386) filed by Commissariat a LEnergie Atomique, SOITEC Silicon On Insulator Technologies SA, SOITEC U.S.A., Inc.. (Attachments: # Certificate of Service)(Kraft, Denise) (Entered: Feb. 28, 2011).
Agarwal et al, "Efficient Production of Silicon-On-Insulator Films by Co-Implantation of HE+ with H+", *Applied Physics Letters*, vol. 72, No. 9, 1988, pp. 1086-1088.
Agarwal, Aditya et al. "Efficient Production of Silicon-On-Insulator Films by Co-Implantation of He$^+$ with H$^{+}$"—Proceedings 1997 IEEE International SOI Conference, Oct. 1997—pp. 44-45.
Ahn, K. Y., et al., "Growth, Shrinkage, and Stability of Interfacial Oxide Layers Between Directly Bonded Silicon Wafers", *Applied Physics A.*, vol. 50, 1990, pp. 85-94.
Alley et al., "Surface Roughness Modification of Interfacial Contacts in Polysilicon Microstructures", Proceedings of the 7$^{th}$ International Conference on Solid-State Sensors and Actuators, *Transducers '93*, Pacifico, Yokohama Japan. Jun 7-10, 1993, pp. 288-291.
Almedia et al. "Bond formation in ion beam synthesized amorphous gallium nitride", *Elsevier, This Solid Films*, 343-344 1999, pp. 632-636.
Ascheron, C., "A Comparative Study of Swelling, Radiation, Strain and Radiation Damage of High-Energy Proton-bombarded GaAs, GaP, InP, Sl and Ge Single Crystals, Nuclear Instruments and Methods in Physics Research", *Nuclear Instruments and Methods in Physics Research* B36, (1989), 1637172.
Ascheron, C., "A Study of Proton Bombardment Induced Swelling of GaP Single Crystals", *Phys. stat. sol.* (a) 92, (1985), pp. 169.
Ascheron, C., "Gettering a Copper in Proton-and Helium-Bombarded Buried Regions of Gallium Phosphide", *Phys. stat. sol.* (a), vol. 106, 1988, pp. 73-79.
Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549.
Ascheron, C., "Proton Beam Modification of Selected AIIIBV Compounds", *Phys. stat. sol.* (a) 124, (1991), pp. 11.
Ascheron, C. et al, "Proton Bombardment Induced Swelling of GaP", 1985, pp. 169-176.
Ascheron, C., "Swelling, Strain, and Radiation Damage of He+ Implanted GaP", *Phys. stat. sol.* (a) 96, 1986, pp. 555-562. (1986).
Asheron, C., "The Effect of Hydrogen Implantation Induced Stress on GaP Single Crystals", *Nuclear Instruments and Methods in Physics Research*, B28 (1987), pp. 350-359.
Aspar et al., "The Generic Nature of the Smart-Cut © Process for Thin-Film Transfer", *Journal of Electronic Materials*, vol. 30, No. 7, Mar. 2001, pp. 834-840.
Aspar et al., Smart-Cut®: The basic fabrication process for UNIBOND® SOI wafers, *SEMI* 1996, pp. 37-46.
Aspar et al., U.S. Appl. No. 09/777,516, also Pub. No. US 2001/0007789 A1 with allowed claims, Published Jul. 12, 2001.
Aspar et al., U.S. Appl. No. 10/784,601, including pending claims, filed Feb. 23, 2004.
Aspar, B. "Basic Mechanisms Involved in the Smart-Cut Process", 1997, pp. 223-240.
Aspar, B. et al, "Characterization of SOI substrates: Application to Recent SIMOX and UNIBOND Wafers," *Electrochemical Society Proceedings*, vol. 96-3, pp. 99-111.
Aspar, B. et al, "Transfer of Structured and Patterned Thin Silicon Films Using the Smart-Cut Process", 1996, pp. 1985-1986.
Aspar, B. Et al., "Ultra Thin Buried Oxide Layers Formed by Low Dose SIMOX Processes", Proc. 6$^{th}$ International Conference on SOI Technology and Devices, *Electro. Soc.*, vol. 94, No. 11, 1994, pp. 62.
Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.
Ashurst et al., "Water Level Anti-Silicon Coatings for MEMS", Sensors and Actuators A104, 2003, pp. 213-221.
Auberton-Herve, A. J. et al, "A New Sal Material: Smart-Cut", 1996, pp. 214-219.
Auberton-Herve, A.J. et al, "SOI Materials for ULSI Applications", *Semiconductor International*, Oct. 1995, 5 pps.
Blanchard-Lagahe C. et al., "Hydrogen and Helium Implantation to Achieve Layer Transfer" vol. 19, pp. 346-358, 2003, *Semiconductor Wafer Bonding VII: Science, Technology, and Applications—Proceedings of the International Symposium*.
Blöchl P.E. et al., First-Principles Calculations of Diffusion Coefficients: Hydrogen in Silicon, *Physical Review Letters*, vol. 64, No. 12, 1990, pp. 1401-1404.
Borgati, Stephen P., "The Root-Mean-Square", Boston College, Nov. 16, 1998, Obtained from the Internet at: <http://www.analytictech.com/mb313/rootmean.htm>.
Bruel, M. et al., (vol. 99-1) Meeting Abstract No. 333, "Single Crystal Semiconductor Layer Delamination and Transfer Through Hydrogen Implantation", the 195$^{th}$ Meeting of the Electrochemical Society, May 2-6, 1999, Seattle, Washington.
Bruel, Michel, "Application of Hydrogen Ion Beams to Silicon on Insulator Material Technology", *Nuclear Instruments and Methods in Physics Research*, B108, 1996, pp. 313-319.

(56) References Cited

OTHER PUBLICATIONS

Bruel, M. et al., "Smart-Cut: A New Silicon on Insulator Material Technology Based on Hydrogen Implantation and Wafer Bonding", 1997, pp. 1636-164, col. 36, Part 1, No. 3B.
Bruel, M. "Smart-Cut Process: the Way to Unibond S.O.I. Wafers", 1996, pp. unknown.
Bruel, M. et al, "Smart-Cut": A Promising New SOI material technology, *Proceedings 1994 IEEE, International Sal Conference*, Oct. 1995, pp. 178-179.
Bruel, M. et al, "Smart-Cut—a new SOI Material Technology based on hydrogen Implantation and wafer bonding," *CEA*, 1996, 24 pages.
Bruel, M., "Silicon on insulator Material Technology", *Electronic Letters*; 31 (1995) Jul. 6; No. 14; pp. 1201-1202.
Bruel, M., "Silicon-an-Insulator", *European Semiconductor*, Mar. 1997.
Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.
Canham et al. "Radiative Recombination Channels due to Hydrogen in Crystalline Silicon", *Materials Science and Engineering*, B4 (1989) pp. 41-45.
Carter et al., "Applications of Ion Beams to Materials", *Inst. Phys. Conf. Ser.*, No. 28, Chapter 1, 1976, pp. 30-36.
Carter, G. et al., The Collection of Ions Implanted in Semiconductors: II Range Distributions Derived From Collection and Sputter-Etch Curves, *Radiation Effects*, 1972, vol. 16, pp. 107-114.
Cassidy, Victor M., "Ion Implantation Process Toughens Metalworking Tools," *Modern Metals*, 1984, pp. 65-67.
Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.
Cerofini et al., "Ultradense Gas Bubbles in Hydrogen-or-Helium-Implanted (or Co-Implanted) Silicon", *Materials Science and Engineering*, B71, 2000, pp. 196-202.
Cerofolini et al., "Hydrogen and Helium Bubbles in Silicon", *Material Science and Engineering 2000*—Reports: A Review Journal, Published by Elsevier Science S.A. 2000, pp. 1-52.
Chu et al, "Radiation Damage of 50-250 keV Hydrogen Ions in Silicon", *Ion Implantation in Semiconductors*, eds. F. Chernob et al., Plenum New York 1976, pp. 483-492.
Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.
Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.
Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.
Cristoloveanu, S. et al, "Electrical Properties of Unibond Material", *Electrochemical Society Proceedings*, vol. 96-3, pp. 142-147.
Csepregl, L. et al. "Regrowth Behavior of Ion-Implanted Amorphous Layers on <111> Silicon", *Applied Physics Letters*, vol. 2, 1976, pp. 92-93.
Cullis, A.G. et al. "Comparative study of annealed neon-, argon-, and krypton-ion implantation damage in silicon,"*J. Appl. Phys.*, 49(10), Oct. 1978, pp. 5188-5198.
Dhara et al, "Mechanism of nanoblister formation in Ga+ self-ion implanted GaN nanowires", *Applied Physics Letters*, vol. 86, No. 20, 2005, p. 203199.
Demeester, et al., "Epitaxial Lift-Off and Its Applications", *Semicond. Sci. Technol.*, vol. 8, 1993, pp. 1124-1135.
Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.
Denteneer, P. et al., "Structure and Properties of Hydrogen-Impurity Pairs in Elemental Semiconductors", Physical Review Letters, vol. 62, No. 16, 1989, pp. 1884-1888.

DiCioccio et al., "III-V Layer Transfer Onto Silicon and Applications", *Phys. Stat. Sol. (a)*, vol. 202, No. 4, 2005 pp. 509-515.
DiCioccio, et al.,"Silicon carbide on Insulator formation using the Smart Cut process", *Electronics Letters*, vol. 32, No. 12, Jun. 6, 1996, pp. 144-145.
Diem et al., "SOI 'SIMOX': From Bulk to Surface Micromachining, A New Age for Silicon Sensors and Actuators", *Sensors and Actuators*, vol. A 46-47, 1995, pp. 8-16.
Dirks, A. G. et al., "Columnar Microstructure in Vapor DEuropesited Thin Films ", *Thin Solid Films*, vol. 47, 1977, pp. 219-233.
Duo, et al., "Comparison Between the different Implantation orders in H+ and He+ Co-implantation", *J. Phys. D. Appl. Phys.* vol. 34, 2001, pp. 477-482.
Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.
Eaglesham, White, Feldman, Moriya and Jacobson, "Equilibrium Shape of Si," *Physical Review Letters*, vol. 70, No. 11, Mar. 15, 1993, pp. 1643-1646.
EerNisse, E., "Compaction of ion-implanted fused silica", *Journal of Applied Physics*, vol. 45, No. 1, Jan. 1974.
EerNisse, E.P., "Role of Integrated Lateral Stress in Surface Deformation of He-Implanted Surfaces" *Journal of Applied Physics*, vol. 48, No. 1, Jan. 1977, pp. 9-17.
Evans, J.H., "An Interbubble Fracture Mechanism of Blister Formation on Helium-Irradiated Metals" *Journal of Nuclear Materials*, 68, 1977, pp. 129-140.
Feijoo et al., "Prestressing of Bonded Wafers", vol. 92-7, 1992, pp. 230-238.
Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.
French Search Report, FA 641570; FR 0312621, Jul. 19, 2004.
Fujitsuka et al., "A New processing Technique to Prevent Stiction Using Silicon Selective Etching for SOT-MEMS", *Sensors and Actruators*, A97-98, 2002, pp. 716-719.
Gamier, D. M., "The Fabrication of a Partial Soi Substrate", Proceedings of the 9th International Symposium on Silicon on Isolator Technology and Devices, vol. 99, Chap. 54, 1990, 73-78.
Gerasimenko, N., "Infrared Absorption of Silicon Irradiated by Protons", *Phys. stat.sol.* (b) 90, (1978), pp. 689-695.
Ghandi, Sorab, "VLSI Fabrication Princiles-Silicon and Gallium Arsenide", *Rensselaer Polytechnic Institute*, 1983, John Wiley & Sons publishers, pp. 135.
Goesele et al., "Semiconductor Wafer Bonding", Science and Technology, ECS Series, *Annual Review of Material Science*, vol. 28, New Jersey, 1999, pp. 215-241.
Greenwald, A.C., "Pulsed-electron-beam annealing of ion-implantation damage", *J. Appl. Phys.* 50(2), Feb. 1978, pp. 783-786.
Grovenor, C.R.M., *Microelectronic Materials*, pp. 73-75 (1989).
Guilhalmenc, C. et al, "Characterization by Atomic Force Microscopy of the SOI Layer Topography in Low Dose SIMOX Materials", *Materials Science and Engineering*, B46, 1997, pp. 29-32.
Haisma et al., Silicon-on-Insulator Wafer Bonding-Wafer Thinning Technological Evaluations, *JAPANese Journal of Applied Physics*, Aug. 28, 1989 No. 8, Part 1, Tokyo, Japan, pp. 1426-1443.
Hamaguchi et al., "Device Layer Transfer Technique using Chemi-Mechanical Polishing"*,JAPANese Journal of Applied Physics*, 23, Oct. 1984, No. 10, Part 2, Tokyo, Japan, pp. L815-L817.
Hamaguchi et al., "Novel LSI/SOI Wafer Fabrication Using Device Layer Transfer Technique", *Proc. IEDM*, 1985, pp. 688-691.
Henttinen et al., "Mechanically Induced Si Layer Transfer if Hydrogen-Implanted Si-Wafers", *American Institute of Physics*, vol. 76, No. 17, 2000, pp. 2370-2372.
Hulett, D.M. et al., "Ion Nitriding and Ion Implantation: a Comparison," *Metal Progress*, 1985, pp. 18-21.
IBM Technical Disclosure Bulletin, *Isolation by Inert Ion Implantation*, 1986, vol. 29 No. 3, pp. 1416.
IBM Technical Disclosure Bulletin, *SOI Interposer Structure XP 000627972*, Jul. 1996, vol. 39 No. 7, pp. 1-5.
International Search Report, PCT/FR2004/002779, Mar. 23, 2005.
International Search Report, PCT/FR2004/002781, Mar. 23, 2005.

(56) References Cited

OTHER PUBLICATIONS

Japanese Office Action dated Oct. 25, 2007 for JAPANese Patent Application No. 2002-581572.
Jaussaud, C. et al., Microstructure of Silicon Implanted With High Dose Oxygen Ions, *Appl. Phys. Lett.*, vol. 48, No. 11, 1985, pp. 1064-1066.
Johnson, "High Fluence Deuteron Bombardment of Silicon", *Radiation Effects*, vol. 32, pp. 159-167.
Jones, K. S. et al., "A Systematic Analysis of Defects in Ion Implanted Silicon", *Applied Physics A.*, vol. 45, 1988 pp. 1-34.
Jones et al., "Enhanced elimination of implantation damage upon exceeding the solid solubility", *J. App. Phys.*, vol. 62, No. 10, 1987, pp. 4114-4117.
Kamada et al, Observation of Blistering and Amorphization on Germanium Surface After 450 keV Ar+ION Bombardment, *Radiation Effects*, vol. 28, 1976, pp. 43-48.
Klem, J.F., "Characteristics of Lift-Off Fabricated AlGaAs/InGaAs Single-StrainedQuantum Well Structures on Glass and Silicon Substrates", *Inst. Phys. Conf.* Ser. No. 96: Chapter 6, (1989), pp. 387-392.
Komarov et al., Crystallographic Nature and Formation Mechanisms of Highly Irregular Structure in Implanted and Annealed S1, Layers*Radiation Effects*, vol. 42, 1979, pp. 169-178.
Kucheyev et al., "Ion Implantation Into GaN", *Materials Science and Engineering*, vol. 33, 2001, pp. 51-107.
Laporte A. et al., "Charged Defects At the Interface Between Directly Bonded Silicon Wafers"—Applied Physics, vol. 36 (Sep. 1997) pp. 5502-5506—Part 1, No. 9A.
Li, J., "Novel Semiconductor Substrate Formed by Hydrogen Ion Implantation into Silicon," Appl. Phys. Lett., vol. 55, No. 21, Nov. 20, 1989, pp. 2223-2224.
Ligeon, E., "Hydrogen Implantation in Silicon Between 1.5 and 60 KeV", *Radiation Effects 1976*, vol. 27, pp. 129-137.
Liu et al., "Investigation of Interface in Silicon-On-Insulator by Fractual Analysis", *Applied Surface Science*, vol. 187, Feb. 28, 2002, pp. 187-191.
Liu et al. "Ion Implantation in GaN At Liquid-Nitoigen Temperature: Structural Characteristics and Amorphization", Physical Review B of the American Physical Society, vol. 57, No. 4, 1988, pp. 2530-2535.
Lu, X., et al., "SOI Material Technology Using Plasma Immersion ION Implantation", Proceedings 1996 IEEE International SOI Conference, Oct. 1996, pp. 48-49.
Maleville, C. et al, "Physical Phenomena involved in the Smart-Cut Process", *Electrochemical Society Proceeding*, vol. 96-3, 1996—pp. 34-46.
Maleville, C. et al, "Wafer Bonding and Hi-Implantation Mechanisms Involved in the Smart-Cut Technology", 1997, pp. 14-19.
Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.
Mastrangelo, C. et al., "Suppression of Stiction in MEMS", *Proceedings of the Materials Research Society Seminar*, vol. 605, 2000, pp. 1-12.
Matsuda et al., "Large Diameter Ion Beam Implantation System," *Nuclear Instruments and Methods*, vol. B21, 1987, pp. 314-316.
Matsuo et al., "Abnormal solid solution and activation behavior in GA-implanted Si(100)", *Appl. Phys. Lett.*, vol. 51, No. 24, 1987, pp. 2037-2039.
Materne, A. et al., "Changes in Stress and Coercivity After Annealing of Amorphous Co (Zr, Nb) Thin Films DEuropesited by R. F. Sputtering", donloaded on Apr. 24, 2009, pp. 1752-1754.
Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.
Miyagawa, S. et al, "Helium Reemission During Implantation of Silicon Carbide", 1982, pp. 2302-2306.
Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.
Moreau, Wayne M., "Semiconductor Lithography, Principles, Practices, and Materials," Plenum Press, 1988. Table of Contents only.
Moriceau, H. et al, A New Characterization Process Used to Qualify SOI Films 1991 pp. 173-178.
Moriceau, H. et al, "A New Characterization Process Used to Qualify SOI Films", 1991 pp. 173-178.
Moriceau, H. et al. "Cleaning and Polishing As Key Steps for Smart-Cut SOI Process", Proceedings 1996 IEEE SOI Conference, Oct. 1996.
Moriceau, H. et al, "The Smart-Cut Process as a Way to Achieve Specific Film Thickness in Sal Structures", 1997, pages unknown.
Moriceau et al., (vol. 99-1) Meeting Abstract No. 405, "A New Characterization Process Used to Qualify SOI Films", The 195$^{th}$ Meeting of the Electrochemical Society, May 2-6, 1999, Seattle, Washington.
Munteanu, D. et al, "Detailed Characterization of Unibond Material", 1997, pp. 395-398.
Myers, D. R., "The effects of Ion-Implantation damage on the first order Raman spectra GaPa)" *J. Appl. Phys.* 54(9), Sep. 1977.
Nethling. J. et al, "Identification of Hydrogen Platelets in ProtonBombarded GaAs", 1985, pp. 941-945.
Nichols C. S et al., "Properties of Hydrogen in Crystalline Silicon Under Compression and Tension", *Physical Review Letters*, vol. 63, No. 10, 1989, pp. 1090-1093.
Nicoletti, S. et al., "Bi-Epitaxial YBCO Grain Boundry Josephson Junctions on SrTiO3 and Sapphire Substrates", *Physics C269*, 1996, pp. 255-267.
Office Action (Non-Final) for U.S. Appl. No. 10/577,175—Dated Jun. 22, 2009. (40).
Office Action (Non-Final) for U.S. Appl. No. 10/975,826—Dated May 5, 2006. (24).
Office Action (Non-Final) for U.S. Appl. No. 10/975,826—Dated Nov, 28, 2006. (24).
Office Action (Non-Final) for U.S. Appl. No. 10/975,826—Dated Jul. 17, 2007. (24).
Office Action (Non-Final) for U.S. Appl. No. 10/975,826—Dated Apr. 1, 2008. (24).
Office Action (Final) for U.S. Appl. No. 10/975,826—Dated Dec. 10, 2008. (24).
Office Action (Non-Final) for U.S. Appl. No. 10/474,984—Dated Sep. 24, 2004.(16).
Office Action (Non-Final) for U.S. Appl. No. 10/474,984—Dated Jun. 6, 2005. (16).
Office Action (Non-Final) for U.S. Appl. No. 10/474,984—Dated Nov. 16, 2005. (16).
Office Action (Non-Final) for U.S. Appl. No. 10/474,984—Dated May 17, 2006. (16).
Office Action (Non-Final) for U.S. Appl. No. 10/474,984—Dated May 7, 2007. (16).
Office Action (Non-Final) for U.S. Appl. No. 10/474,984—Dated Feb. 6, 2008. (16).
Office Action (Final) for U.S. Appl. No. 10/474,984—Dated Oct. 17, 2008. (16).
Office Action (Non-Final) for U.S. Appl. No. 10/474,984—Dated Jul. 7, 2009. (16).
Office Action (Non-Final) for U.S. Appl. No. 10/534,199—Dated Feb. 19, 2009. (25).
Office Action (Final) for U.S. Appl. No. 10/534,199—Dated Aug. 5, 2009.(25).
Office Action (Non-Final) for U.S. Appl. No. 11/747,733—Dated Mar. 16, 2009. (48).
Ono et al., "Orientation Dependence of Flaking of Ion Irradiated Aluminum Single Crystals", *Japanese Journal of Applied Physics*, vol. 25, No. 10, 1986, pp. 1475-1480.
Paszti, E, "Flaking and Wave-Like Structure on Metallic Glasses Induced by MeV-Energy Helium Ions", *Nuclear Instruments and Methods*, vol. 209/210, (1983), pp. 273-280.
Picraux, S. Thomas et al., "Ion Implantation of Surfaces," *Scientific American*, vol. 252, No. 3, pp. 102-113 1985.

(56) References Cited

OTHER PUBLICATIONS

Pollentier, et al., "Fabrication of High-Radiance LEDs by Epitaxial Lift-Off", *SPIE*, vol. 1361, 1990, pp. 1056-1062.
Popov, V.P. et al., "Blistering on a Silicon Surface in the Process of Sequential Hydrogen/Helium ION Co-Iplantation"—Optoelecironics Instrumentation and Data Processing, No. 3, Apr. 5, 2001—pp. 90-98—2001.
Primak, W., "Impurity Effect in the Ionization Dilation of Vitreous Silica" *J. Appl. Phys.* 39(13) 1968.
Reissue U.S. Appl. No. 10/449,786.
Renier, M. et al., "A New Low-Energy Ion Implanter for Bombardment of Cylindrical Surfaces," *Vacuum*, vol. 35, No. 12, pp. 577-578, 1985.
Roth, J., "Blistering and Bubble Formation" *Inst. Phys. Conf. Ser.* No. 28, 1976: Chapter 7, pp. 280-293.
Sah, Chih -Tang et al., "Deactivation of the Boron Acceptor in Silicon by Hydrogen," *Appl. Phys. Lett.* 43, (2), Jul. 1983, pp. 204-206.
Saint-Jacques R. G., "La Formation des Cloques", *Nuclear Instruments and Methods*, No. 209/210, North Holland Publishing Co., 1983, pp. 333-343.
Schnell et al., "Plasma Surface Texturization for Multicrystaline Silicon Solar Cells", *IEEE*, XXVIII, Photovoltaic Conference, 2000, pp. 367-370.
Shintani, A. et al., "Temperature dependence of stresses in chemical deposited vitreous films", *J. Appl. Phys.*, vol. 51, No. 8, 1980, pp. 4197.
Silicon-On-Insulator, *European Semiconductor*, Mar. 1997, pp. 17 and 18.
Sioshansi, Piran, "Ion Beam Modification of Materials for Industry," *Thin Solid Film*, vol. 118, 1984, pp. 61-71.
Snyman, H. C., "Transmission Electron Microscopy of Extended Crystal Defects in Proton Bombarded and Annealed GaAs", *Radiation Effects*, 1983, vol. 69, pp. 199-230.
Snyman, H. C. et al, "Void Formation in Annealed Proton-Bombarded GaAs", 1981, pp. 243-245.
Stein, Myers and Follstaedt, "Infrared Spectroscopy of chemically bonded hydrogen at voids and defects in silicon", *J. Appl. Phys.* 73(b6), Mar. 15, 1993, pp. 2755-2764.
Stephen, D., "Investigation of Lattice Strain in Proton-Irradiated GaP by a Modified Auleytner Technique" *Phys. stat. sol.* (a) 87, 1985, pp. 589-596.
Sunkara et al., "Bulk synthesis of silicon nanowires using a low-temperature vapor-liquid-solid solution", *Applied Physics Letters*, vol. 79, No. 10, Sep. 3, 2001, pp. 1546-1548.
Suzuki et al., "High-Speed and Low Power n+- p+Double-Gate SOI CMOS", *IEICE Trans. Electron.*, vol. E78-C, No. 4, 1995, pp. 360-367.
Sze, S.M., VLSI Technology, 2.sup.nd Ed., 1988, pp. 9-10.
Tan, T. Y. et al., "On Oxygen Precipitation Retardation/Recovery Phenomena, Nucleation Incubation Phenomena and the Exigent-Accomodation-vol. Factor of Precipitation", Proceedings of the 5$^{th}$ International Symposium on Silicon Materials Science and Technology, *Semiconductor Silicon 198 Electrochem. Soc.*, New Jersey, 1986, pp. 864-873.
Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.
Terreault, Bernard, "Hydrogen Blistering of Silicon: Progress in Fundamental Understanding", *Phys. Stat. Sol.* (a) 204, No. 7, 2007, pp. 2129-2184.
Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-159.
Timoshenko, S. et al., "Analysis of Bi-Metal Thermostats", *J. Opt. Soc. Am.*, vol. 11, 1925, pp. 233-256.
Tong et al., "Low Temperature Si Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology—94*, (1995) pp. 801-804.
Tzeng, J.C., "A Novel Self-Aligned Oxgyen (Salox) Implanted SOI Mosfet Device Structure" *Nuclear Instruments and Methods in Physics Research* B2, 1987, pp. 112-115.
U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.
Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.
Van de Walle, C. "Theoretical Aspects of Hydrogen in Crystalline Semiconductors", *Physica B*, Holland, vol. 170, No. 15, 1991, pp. 21-32.
Van de Walle, C. "Theory of Hydrogen Diffusion and Reactions in Crystalline Silicon", *Physical Review Letters*, vol. 64, No. 6, 1980, pp. 669-672.
Van de Walle, C. "Theory of Hydrogen Diffusion and Reactions in Crystalline Silicon", *Physical Review B*, vol. 39, No. 15, 1989, pp. 10 791-10 808, plus diagrams.
Van Swijgenhoven et al. "Helium Bubble and Blister Formation for Nickel and an AMorphous Fe—Ni—Mo—B Alloy During 5 key He-+-Irradiation at Temperatures Between 200 K and 600", *Nuclear Instruments and Methods*, 209/210, 1983, pp. 461-468.
Veldkamp, W.B. et al., "Binary Optics," *Scientific American*, 1992, pp. 50-55.
Venezia et al., "The Role of Implantation Damage in the Production of Silicon-On-Insulator Films by Co-Implantation of He$^+$ and H$^{+}$", Electrochemical Society Proceedings vol. 98-1, 1998—pp. 1384-1395.
Weldon et al., "Mechanism of Silicon Exfoliation Induced by Hydrogen/Hekium Co-implantation", Applied Physics Letters, vol, 73, No. 25, pp. 3721-3723, Dec. 21, 1998.
Wemple, S.H., "Optical and channeling studies of ion-bombarded GaP", *J. Appl. Phys.*, vol. 45, No. 4, Apr. 1974, pp. 1578-1588.
Whitton, J. L. et al., "The Collection of Ions Implanted in Semiconductors: 1 Saturations Effects", *Radiation Effects*, Scotland, vol. 16, 1972, pp. 101-105.
Wiegand, M. et al., "Wafer Bonding of Silicon Wafers Covered With Various Surface Layers", *Sensors and Actuators*, Elsevier Science B.V., vol. 86, 2000, pp. 91-95.
Williams J. et al., "Annealing behaviour of high-dose rare-gas implantations into silicon", from Application of Ion Beans to Materials, 1975, Chap. 1, *Inst. Phys. Conf.* Ser. No. 28, 1976, pp. 30-36.
Wittmaack et al., "High Fluence Retention of Noble Gases Implanted in Silicon" *Radiation Effects*, vol. 39, 1978, pp. 81-95.
Wolf, Stanley Ph.D., Silicon Processing for the VLSI Era (vol. 2), Lattice Press, 1990, pp. 66-79.
Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.
Yamaguchi H. et al., "Intelligent Power IC With Partial Soi Structure", *Jpn. J. Appl. Phys.*, vol. 34, 1995, pp. 864-868.
Yee et al., "Polysilicon Surface-Modification Technique to Reduce Sticking of Microstructures", *Sensors and Actuators* A 52, 1996, pp. 145-150.
Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.
Yun et al., "Thermal and Mechanical Separations of Silicon Layers From Hydrogen Pattern-Implanted Wafers", *Journal of Electronic Materials*, vol. 38, No. 8, Apr. 24, 2001, pp. 960-964.
Yun, H. et al., "Transfer of Patterned Ion-Cut Silicon Layers", *Applied Physics Letters*, vol. 73, No. 19, 1998, pp. 2772-2774.
U.S. District Court District of Delaware (Wilmington) Civil Docket for Case #: 1:08-cv-00292-SLR—(19 pgs).
Stipulation to extend date to Jun. 19, 2009 by which defendant may file an answering brief in opposition to plaintiffs' Partial Motion to

(56) References Cited

OTHER PUBLICATIONS

Dismiss Counterclaim Counts II, III, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc.. (Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests for Production of Documents and Things (Nos. 133-135) re 41 Notice of Service by SOITEC Silicon on Insulator Technologies SA, Commissariat a LEnergie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).
Notice of Service of MEMC's Second Request for Production of Documents and Things Directed to S.O.I.TEC Silicon on Insulator Technologies, S.A. and Soitec USA, Inc. by MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).
Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon on Insulator Technologies SA, Commissariat a L'Energie Atomique re 51 Notice of Service, (Attachments: # 1 Certificate of Service)(Kraft, Denise) (Entered: Jul. 17, 2009).
Notice of Service of SOITEC's Objections and Responses to MEMC's Second Request for Production of Documents and Things Directed to SOITEC re 46 Notice of Service by SOITEC Silicon on Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).
Notice of Service of MEMC Electronic Materials, Inc.'s Second Set of Interrogatories Directed to S.O.I.TEC Silicon on Insulator Technologies, S.A., Soitec USA, Inc. and Commissariat a L'Energie Atomique by MEMC Electronic Materials Inc..(Rogowski, Patricia) (Entered: Jul. 17, 2009).
Notice of Service of Soitec's Production of Documents Bates Numbered SCEA 00000001 to SCEA 00002442 by SOITEC Silicon on Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).
Notice of Service of MEMC's Production of Documents Bates Numbered MEMC0300000 to MEMC0306530 by MEMC Electronic Materials Inc. (Rogowski, Patricia) (Entered: Jul. 20, 2009).
First Amended Complaint for *Patent Infringement* against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Notice of Service of Soitec S.A.'s Second Set of Interrogatories (Nos. 18-22) and CEA's First Set of Interrogatories (Nos. 1-11) by SOITEC Silicon on Insulator Technologies SA, Commissariat a L'Energie Atomique. (Attachments: # 1 Certificate of Service)(Kraft, Denise) (Entered: Jul. 23, 2009).
Notice of Service of S.O.I.TEC Silicon on Insulator Technologies, S.A. and Commissariat a Lenergie Atomique Supplemental Production of Documents Bates Numbered Slit 00000001 to Slit 00049728 re 43 Notice of Service, by SOITEC Silicon on Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Notice of Service of MEMC's Production of Documents Bates Numbered MEMC0300000-MEMC0337055 by MEMC Electronic Materials Inc. (Rogowski, Patricia) (Entered: Aug. 5, 2009).
Notice of Service of S.O.I.TEC Silicon on Insulator Technologies, S.A. and Commissariat a L Energie Atomique's Revised Supplemental Production of Documents Bates Numbered SLIT00000001-SLIT0004886; SLIT00004931 SLIT00004985; SLIT00005169 SLIT00005174; SLIT00005241 SLIT00006368; and SLIT00006886-SLIT00049728 re 59 Notice of Service, by SOITEC U.S.A., Inc., SOITEC Silicon on Insulator Technologies SA, Commissariat a LEnergie Atomique. Related document: 59 Notice of Service, filed by SOITEC Silicon on Insulator Technologies SA, Commissariat a LEnergie Atomique. (Attachments: # 1 Certificate of Service)(Kraft, Denise) (Entered: Aug. 6, 2009).
Stipulation to Extend Time to Answer or Otherwise Respond to MEMC's Amended Counterclaims to Aug. 31, 2009—filed by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

(56) References Cited

OTHER PUBLICATIONS

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service by SOITEC Silicon on Insulator Technologies SA, SOITEC U.S.A., Inc., Commissariat a L'Energie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Aug. 26, 2009).
Notice of Service of MEMC's Supplemental Answers to SOITEC's First Set of Interrogatories by MEMC Electronic Materials Inc.. (Rogowski, Patricia) (Entered: Aug. 27, 2009) So Ordered—re 63 Stipulation to Extend Time. Set/Reset Answer Deadlines: Soitec Silicon on Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).
Answer to 60 Answer to Amended Complaint, Counterclaim,,, Counterclaim *Reply to Defendant's Amended Counterclaims, Counterclaims and Affirmative Defenses* against MEMC Electronic Materials Inc. by SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).
Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).
Notice of Service of Soitec S.A.'s Third Set of Interrogatories (Nos. 23-27) re 58 Notice of Service, by SOITEC Silicon on Insulator Technologies SA, SOITEC U.S.A., Inc., Commissariat a LEnergie Atomique. Related document: 58 Notice of Service, filed by SOITEC Silicon on Insulator Technologies SA, Commissariat a LEnergie Atomique. (Attachments: # 1 Certificate of Service)(Kraft, Denise) (Entered: Sep. 22, 2009).
Notice of Service of MEMC Electronic Materials Inc.'s Answers to SOITEC S.A.'s Second Set of Interrogatories (Nos. 8-22) and MEMC Electronic Materials, Inc.'s Answers to CEA's First Set of Interrogatories (Nos. 1-11) by MEMC Electronic Materials Inc.. (Rogowski, Patricia) (Entered: Oct. 16, 2009).
Notice of Service of S.O.I.TEC Silicon on Insulator Technologies, S.A. and Commissariat a L'Energie Atomique's Supplemental Production of Documents Bates Numbered SOIT 00003529 to SOIT 00004244 by SOITEC Silicon on Insulator Technologies SA, Soitec U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001-.009; (Con't)—SOIT 00003409.001-.015; and SOIT 00003469.001-.015 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of SOITEC/CEA Parties' Objections and Responses to MEMC Electronic Materials, Inc.'s Second Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon on Insulator Technologies, S.A. and Commissariat LEnergie Atomique Supplemental Production of Documents Bates Numbered SOIT 00004245 to SOIT 00205027 by SOITEC Silicon on Insulator Technologies SA, SOITEC U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).
Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Notice of Service of MEMC's Production of Documents Bates Numbered MEMC0338048-MEMC0345027 by MEMC Electronic Materials Inc..(Rogowski, Patricia) (Entered: Oct. 23, 2009).
Notice of Service of S.O.I.TEC Silicon on Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates No. (lid) (Entered: Oct. 23, 2009).
Notice of Service of of S.O.I.TEC Silicon on Insulator Technologies, S.A. and Commissariat a L'Energie Atomique's Supplemental Production of Documents Bates Numbered SOIT 00205028 to SOIT 00206175; SCEA 00002443 to SCEA 00003974; and SLIT 00060613 to SLIT 00063784 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of MEMC's Answers Tosoitec S.A.'s Third Set of Interrogatories (Nos. 23-27) by MEMC Electronic Materials Inc.. (Rogowski, Patricia) (Entered: Oct. 28, 2009).
Notice of Service of S.O.I.TEC Silicon on Insulator Technologies, S.A. and Commissariat a L'Energie Atomique's Supplemental Production of Documents Bates Numbered SOIT 00206176 to SOIT 00206183 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of SOITEC/CEA Parties' Objections and Responses to MEMC Electronic Materials, Inc.'s Third Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 29, 2009).
International Search Report.
French Written Opinion.
U.S. District Court District of Delaware (Wilmington) Civil Docket for Case #: 1:08-cv-00292-SLR—(11 pgs).
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Nos. RE39,484 E; 6,809,009; 7,067,396 B2; (sns, ) (Entered: May 20, 2008) (1 pg).
Summons Returned Executed by SOITEC Silicon on Insulator Technologies SA, Commissariat a LEnergie Atomique. MEMC Elec-

(56) References Cited

OTHER PUBLICATIONS tronic Materials Inc. served on May 19, 2008, answer due Jun. 9, 2008. (Kraft, Denise) (Entered: May 20, 2008) (2 pgs).
MOTION for Pro Hac Vice Appearance of Attorney George W. Neuner, Alan M. Spiro, Brian M. Gaff and Carolyn D'Agincourt—filed by SOITEC Silicon on Insulator Technologies SA, Commissariat a LEnergie Atomique. (Attachments: # 1 Certificate of Compliance Certification by Counsel to Be Admitted Pro Hac Vice, # 2 Certificate of Compliance Certification by Counsel to Be Admitted Pro Hac Vice, # 3 Certificate of Compliance Certification by Counsel to Be Admitted Pro Hac Vice, # 4 Certificate of Compliance Certification by Counsel to Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon on Insulator Technologies SA. (Attachments: # 1 Certification by Counsel to be Admitted Pro Hac Vice, # 2 Certification by Counsel to be Admitted Pro Hac Vice, # 3 Certification by Counsel to be Admitted Pro Hac Vice, # 4 Certification by Counsel to be Admitted Pro Hac Vice, # 5 Certification by Counsel to be Admitted Pro Hac Vice)(Kraft, Denise) (Entered: Jun. 10, 2008) (8 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc.. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc.. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a LEnergie Atomique.Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc.. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc.. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc.. (Attachments: # 1 Exhibit Certification by Counsel to be Admitted Pro Hac Vice)(Rogowski, Patricia) (Entered: Feb. 23, 2009) (4 pgs).

Notice of Service of Plaintiffs' Initial Disclosures Pursuant to Fed. R. Civ. P. 26(a)(1) by SOITEC Silicon on Insulator Technologies SA, Commissariat a LEnergie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc..(Rogowski, Patricia) (Entered: Mar. 6, 2009) (3 pgs).
Proposed Order Proposed Scheduling Order re 16 Memorandum and Order Set Hearings, by SOITEC Silicon on Insulator Technologies SA, Commissariat a LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon on Insulator Technologies SA, Commissariat a LEnergie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order Set Hearings, by SOITEC Silicon on Insulator Technologies SA, Commissariat a LEnergie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joinder of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a LEnergie

(56) References Cited

OTHER PUBLICATIONS

Atomique.Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat a L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec Usa, Inc. and Commissariat a L'Energie Atomique by MEMC Electronic Materials Inc.. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc.. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc..(Rogowski, Patricia) (Entered: Apr. 23, 2009) (4 pgs).

\* cited by examiner

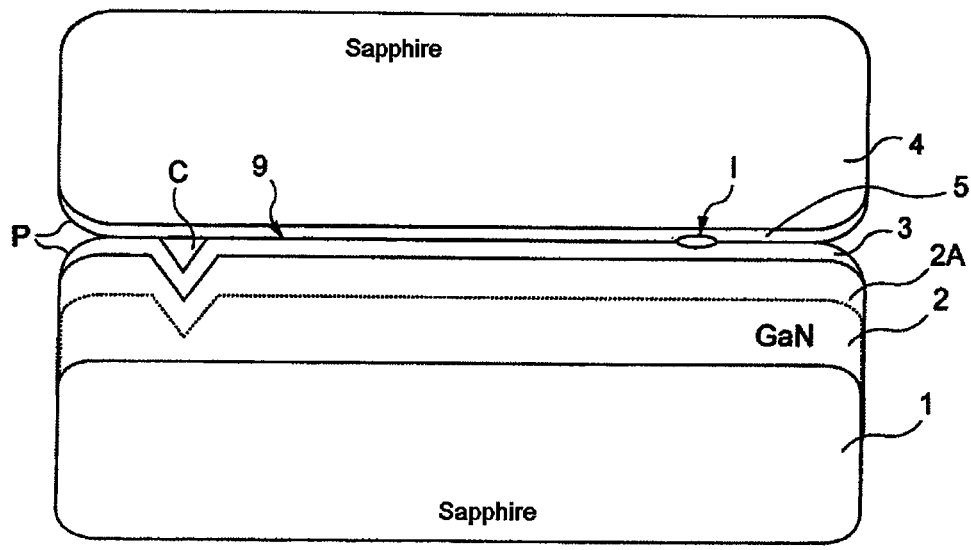
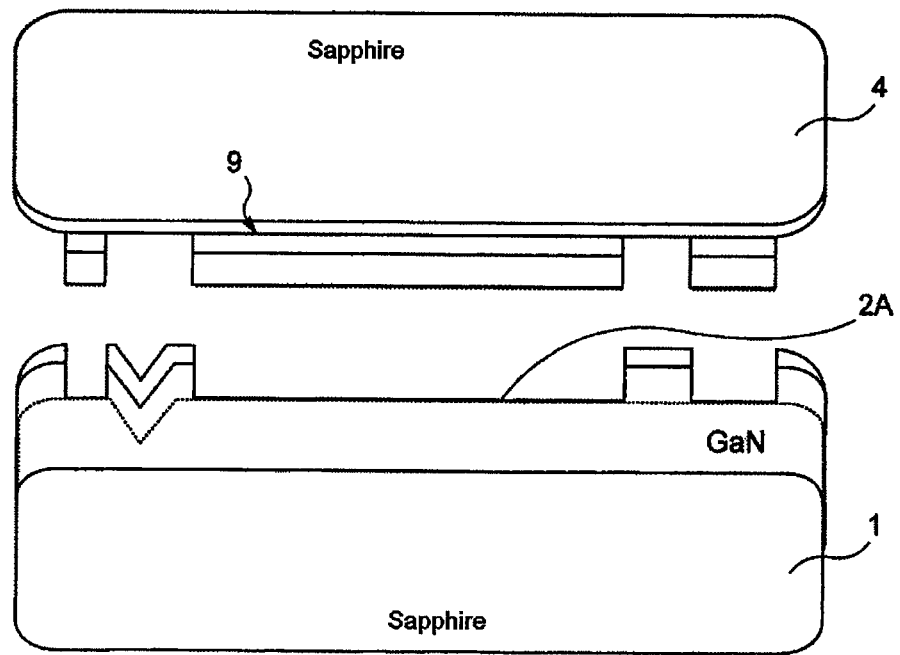

METHOD FOR PREPARING THIN GAN LAYERS BY IMPLANTATION AND RECYCLING OF A STARTING SUBSTRATE

PRIORITY CLAIM

This application is a nationalization under 35 U.S.C. 371 of PCT Application No. PCT/FR2007/002100 filed Dec. 18, 2007, which claims priority to French Patent Application No. 0655664, filed Dec. 19, 2006, and incorporated by reference herein.

TECHNICAL FIELD

The invention concerns a method of fabrication of thin layers (also referred to as thin films) of GaN for applications of microtechnology.

BACKGROUND

The method known by the name "Smart Cut®" is used to detach a thin film and to transfer it onto a support, sometimes called a stiffener, by performing the following steps:

1. bombardment of one face of an initial substrate with gaseous species or ions (H or rare gases), in order to implant those ions (or atoms) in a concentration sufficient to create a layer of microcavities,
2. bringing of this face of the substrate into intimate contact (typically by molecular bonding) with a second substrate called the support or stiffener,
3. fracturing of the layer of microcavities by the application of a heat treatment and/or a detachment stress (for example, the insertion of a blade between the two substrates and/or application of traction and/or bending and/or shear forces and/or application of ultrasound or of microwaves of judiciously chosen power and frequency), and
4. recycling of the substrate.

In the case of the production of heterostructures, for example in the case of the transfer of a thin film of a material A onto a substrate of material B, if the step 2 of bringing the two substrates into intimate contact is followed by a heat treatment (consolidation of the intimate contact (bonding) or thermal fracture), unbonding or rupture of the two bonded substrates can be observed. Because of their intrinsic properties, the different materials A and B generally have different coefficients of thermal expansion (CTE). The more different the CTE, the less readily can the integrity of the bonded structure be maintained at high temperatures. Accordingly, in the case of a self-supporting GaN substrate of approximately 325 microns thickness (denoted ~325 μm) bonded to a sapphire substrate of thickness ~330 μm, the two bonded substrates must not in practice be heated to a temperature beyond approximately 230° C. (i.e. not beyond ~230° C. using the above notation): beyond 230° C., unbonding of the two substrates is observed, i.e. their detachment from each other at the bonding interface. This low temperature resistance is particularly problematic for the fracture step 3, since this step generally consists in whole or in part of a heat treatment, and heat treatments are in practice conducted at much higher temperatures. The bonding temperature resistance therefore limits the fracture heat treatment.

It is known from U.S. Pat. No. 5,877,070 (primarily concerning silicon, silicon carbide, germanium or diamond) that a sensitization step by heat treatment (at high temperature) of the implanted plate before the bonding step reduces the subsequent fracture heat treatment. The problem is that this sensitization step is of limited effect: it must not induce deformation of the surface in the form of blisters or even exfoliated areas. This in practice implies that the sensitization cannot represent more than about 10% of the fracture thermal budget; as a result of this the fracture treatment proper, after bonding to the stiffener, must therefore rely on approximately 90% of the fracture thermal budget. This limited sensitization therefore does not enable a significant reduction in the fracture treatment as such, with the result that the limitation imposed by the bonding temperature resistance remains even after such sensitization treatment. It is appropriate to mention here that the fracture thermal budget corresponds to the annealing time necessary to produce the fracture for a given annealing temperature (it is clear that the fracture time depends on the annealing temperature); the fracture thermal budget depends on the implantation conditions, notably on the nature of the ions (or atoms) implanted, their dose, their energy, the substrate implanted, etc.

The step 2 of bringing the implanted substrate into intimate contact with the stiffener must in principle be effected with plane and perfectly clean surfaces. The problem is that, when it takes place, this bringing into intimate contact cannot be produced effectively over all of the surface of the substrates:

firstly, the edges of the plates forming the substrates are generally chamfered and therefore cannot be brought into contact; this problem of non-bonding at the edge of plates is encountered for all materials (Si, Ge, GaAs, GaN, sapphire, SiGe, $LiTaO_3$, $LiNbO_3$, SiC, InP, etc.) and for all plate diameters between 5 cm and 30 cm (in practice between 2 inches and 12 inches);

in the case of substrates or layers structured intentionally (for example by patterns produced photolithographically) or unintentionally (for example by growth defects in the case of epitaxial layers or by defects linked to the deposition of a layer on the initial substrate), patterns or defects that are recessed in the surface give rise to non-bonded areas (NBA);

finally, in the case of insufficiently effective cleaning, the presence of particles ("dust") at the bonding interface also gives rise to NBA.

In the fracture step, if the dimension of the NBA is large relative to the thickness of the film to be transferred (for example with a ratio (NBA lateral dimension)/(film thickness) of approximately 10), the thin film remains locally fastened to the initially implanted substrate. These areas are called non-transferred areas (NTA).

These bonding defects can even lead to highly localized (over dimensions of a few square microns) lifting or even detachment of the thin film, in the form of blisters or exfoliated areas, which has to be avoided completely.

By way of example, FIG. 1 represents a substrate 1, here of sapphire, onto which a layer 2, here of GaN, has been deposited and has then undergone implantation that has resulted in the formation of an implanted area 2A. On this layer 2 is represented an optional bonding layer 3. This layer 2 is in intimate contact at an interface 9 with another substrate 4, here also of sapphire, and also provided with an optional bonding layer 5, for example similar to the layer 3.

It is seen that, the substrates being chamfered, the peripheral areas P are not bonded. Moreover, because of a defect that has occurred when depositing the GaN layer, there is a recess in the bonding layer 3 and therefore a non-bonded area C. Finally, the reference I represents dust trapped between the bonding surfaces (remaining after ineffective cleaning) and locally reducing or even eliminating the mechanical strength of the bonding interface 9.

It is seen in FIG. 2 that, at the time of fracture in the implanted area, there remain non-transferred areas in vertical alignment with the peripheral areas, the growth defect and the dust.

According to a notable advantage of the "Smart Cut®" technology, the initially implanted substrate can, after peeling a thin film during the fracture step, be recycled for other, analogous transfer cycles. However, it has just been seen that the thin film remains locally attached to the substrate in the non-transferred areas, therefore forming steps with a thickness typically between 10 and 1000 nm (corresponding to the thickness of the thin film). Moreover, implantation followed by fracture generally cause roughness to appear at the bared surface of the substrate. It follows from this that recycling the substrate from which a thin film has just been detached generally necessitates particular leveling steps, notably by mechanical polishing and/or chemical attack (this is explained in particular in the documents EP-A-1 427 002 and EP-A-1 427 001).

SUMMARY

The invention overcomes the drawbacks cited above in the case of gallium nitride, and in particular, to enable the detachment by fracture of a thin layer of GaN, or its transfer onto a host substrate, in times that are realistic on an industrial scale, at the same time as forming, at the time of such fracture, free surfaces involving no significant leveling treatment (because of not having the steps described above), so that the remainder of the starting substrate can then be reused (recycled), if required, substantially as it stands, for a new cycle of formation of a thin film. Another object of the invention is to enable transfer to a host substrate at temperatures sufficiently low for there to be no risk of unbonding between the starting substrate and the host substrate because of too great a difference between the coefficients of thermal expansion of those substrates.

To this end the invention proposes a method of fabrication of a thin layer of GaN from a starting substrate of which at least a thick surface area along a starting substrate free face is in GaN, comprising the following steps:

bombardment of said free face of the starting substrate with helium and hydrogen ions, the helium being implanted first in the thickness of said thick area and the hydrogen being implanted second, the doses of helium and of hydrogen each being between $10^{17}$ atoms/cm$^2$ and $4.10^{17}$ atoms/cm$^2$, application to the starting substrate of a fracture treatment adapted to cause the detachment from a remainder of the starting substrate of all the portion of the thick area of GaN situated between the free face and the implantation depth of the helium and of the hydrogen.

It has become apparent that the conditions of the invention, in relation to the detachment phenomenon, enable surfaces of low roughness (without significant steps) to be obtained at temperatures sufficiently low for there to be no risk of unbending in the case of transfer onto a host substrate.

It is to be noted that the implantation conditions determine the implantation depths.

According to advantageous features of the invention, where appropriate combined:

the implantation dose of the helium is at least equal to the implantation dose of the hydrogen, the remainder of the starting substrate after fracture (or detachment) is recycled; in this case, the method advantageously further includes a treatment of preparation of the remainder of the starting substrate, before its recycling, involving at most one polishing of at most 1 micron thickness (typically of the order of 0.2 micron), or even no treatment at all, the starting substrate is, before the detachment, brought into intimate contact with a host substrate via said free face; this bringing into intimate contact is advantageously a molecular bonding; at least one layer is preferably deposited on the free surface of the starting substrate before bringing it into intimate contact with the host substrate, in particular to protect one or the other of these surfaces or to facilitate bonding, the fracture treatment includes the application to the starting substrate, before this bringing into intimate contact, of an embrittlement treatment including a heat treatment and corresponding to at least 85% of the thermo-mechanical budget necessary for obtaining the fracture of this starting substrate at the implantation depth of the hydrogen, this embrittlement treatment advantageously includes a step of depositing a layer in vapor form, this embrittlement treatment advantageously includes the application of mechanical stresses (for example application of light tension, because of the contact with a layer having different thermal properties but a small thickness (typically less than the order of one micron)), this embrittlement heat treatment is preferably effected at a temperature of at most 400° C., preferably at most equal to 300° C., this embrittlement treatment consists for example mainly of an embrittlement heat treatment carried out for at least 85% of the time necessary to obtain thermal fracture, this embrittlement treatment advantageously corresponds to a thermo-mechanical budget of at least 95% of the budget necessary to obtain the detachment of the thin layer; it can theoretically be chosen greater than 99%, or even 99.99%, but to guarantee that the starting substrate retains sufficient mechanical strength for bringing it into intimate contact with a host substrate, where applicable, this budget is preferably at most equal to 99% of the budget necessary for fracture, the residual fracture treatment is advantageously effected at a temperature at most equal to 250° C., for example at room temperature, this treatment advantageously includes the application of mechanical stresses, preferably at room temperature, the residual fracture treatment includes the application of heat treatment and/or a detachment stress, for example by the application of ultrasound and/or microwaves (of judiciously chosen power and frequency), the implantation dose of helium is preferably between $1.10^{17}$ and $2.10^{17}$ He$^+$/cm$^2$ (preferably of the order of $2.10^{17}$ He$^+$/cm$^2$), and the hydrogen implantation dose is advantageously in the same range (between $1.10^{17}$ and $2.10^{17}$ H$^+$/cm$^2$), preferably also of the order of $2.10^{17}$ H$^+$/cm$^2$; thus the implantation doses of hydrogen and helium are advantageously each substantially equal to $2.10^{17}$ atoms/cm$^2$, the cumulative implantation dose is between $3.10^{17}$ atoms/cm$^2$ and $4.5\ 10^{17}$ atoms/cm$^2$, preferably between $3.5\ 10^{17}$ atoms/cm$^2$ and $4\ 10^{17}$ atoms/cm$^2$, approximately, the implantation energy for the helium implantation step is greater than the implantation energy for the hydrogen implantation step, the helium implantation energy is between 90 keV and 210 keV and the hydrogen implantation energy is between 60 keV and 120 keV, the method advantageously further includes a finishing heat treatment for perfecting the detachment of all the thin layer, including in any non-bonded areas.

It is to be noted that the principle of co-implantation of hydrogen and helium has already been proposed, notably with a view to obtaining for the thin film a free surface of good roughness. There may be cited in this regard PCT Patent Application Publication Nos. WO-A-2004/044976, WO-A-2004/042779, WO-A-2005/013318 and WO-A-2005/043615. However, these documents in practice propose to profit from the presence of the two implantation elements to reduce as much as possible the implantation dose of each of the elements below $5.10^{16}$ at/cm$^2$, bonding of the first substrate to a second substrate before any significant heat treatment, and usually heat treatments at high temperatures.

Moreover, U.S. Patent Publication Nos. 2004/0262686 and 2005/0269671 have already proposed steps of transfer from gallium nitride using co-implantation of hydrogen and helium in the gallium nitride, but with doses less than those proposed by the invention and without specifying the order of implantation (the second document cited above merely mentions the possibility of co-implantation without specifying how to perform this). These documents are not concerned with the quality of the surface resulting from the detachment of the thin film and can therefore in no way have identified how the order and doses of implantation can impact on the quality of this surface quality.

It must be noted in this regard that, given that implantation leads to a disturbance of the crystal lattice over a certain thickness, the requirement to have for the thin film a rear surface that is very clean and plane had the a priori consequence that the surface of the starting substrate bared by the detachment of the thin layer was significantly degraded, especially if the doses were high. However, the invention is founded on the observation that appropriate choices of implantation conditions enable the advantages mentioned above to be obtained.

Without the physical mechanisms having been elucidated, it seems that the helium atoms diffuse toward the defects created by the hydrogen to tension them; given the high implantation dose of the hydrogen, comparable to that routinely used to cause fracture by itself, the additional implantation of helium confers on the defects generated by the implantation of hydrogen an optimum efficacy, with the result that their coalescence is produced very neatly, whence the formation of a very clean separation interface.

It has even become apparent that, as soon as the cumulative implantation dose was high, that is to say at least equal to $3.10^{17}$ atoms/cm$^2$, the presence of hydrogen was not necessary.

Thus, another aspect of the invention proposes a method of fabrication of a thin layer of GaN from a starting substrate of which at least a thick surface area along a free face of the starting substrate is in GaN, comprising the following steps:

bombardment of said free face of the starting substrate with helium ions and then, optionally, hydrogen ions, the helium being implanted first in the thickness of said thick area, the cumulative implantation dose being between $3.10^{17}$ atoms/cm$^2$ and $4.5\ 10^{17}$ atoms/cm$^2$ inclusive, consisting at least in the most part of helium, application to the starting substrate of a fracture treatment adapted to cause the detachment from a remainder of the starting substrate of all the portion of the thick area of GaN situated between the free face and the implantation depth of the helium.

The implantation dose advantageously consists entirely of helium, of the order of approximately $4.10^{17}$ atoms/cm$^2$ (that is to say between $3.5\ 10^{17}$ atoms/cm$^2$ and $4.5\ 10^{17}$ atoms/cm$^2$, even between $3.75\ 10^{17}$ atoms/cm$^2$ and $4.25\ 10^{17}$ atoms/cm$^2$).

Because there has been co-implantation of helium and hydrogen or implantation of only helium, the invention leads to delamination that is easily extended to the whole of the section of the starting substrate (even if it means lengthening the fracture treatment), and is therefore independent of the existence of localized bonding defects or the absence of bonding at the periphery; this contributes to guaranteeing that the bared surface of the remainder of the starting substrate is neat and clean.

BRIEF DESCRIPTION OF THE DRAWING

Objects, features and advantages of the invention emerge from the description that follows, given with reference to the appended drawings, in which:

FIG. 1 is a theoretical diagram representing a combination of a GaN substrate deposited on a sapphire substrate and that has been implanted, bonded to another sapphire substrate but featuring non-bonded areas, FIG. 2 is a theoretical diagram representing the combination from FIG. 1, after separation in the implanted area but featuring non-transferred areas.

DETAILED DESCRIPTION

Figure 3:
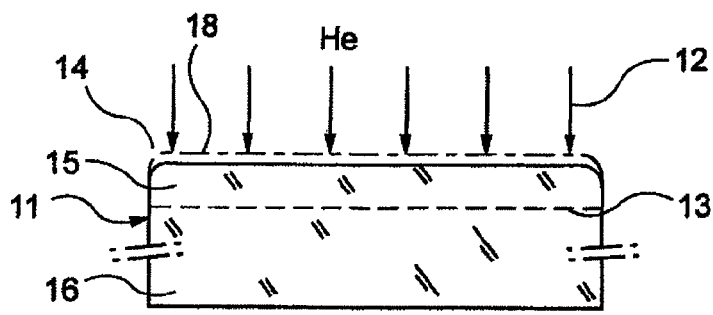
FIG. 3 is a diagram of a first implantation step of a method of the invention.
Figure 4:
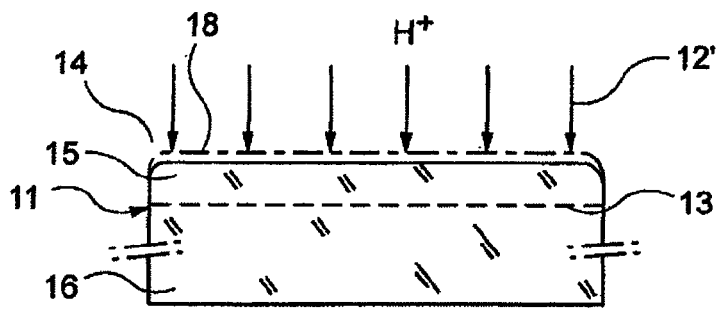
FIG. 4 is a diagram of a second implantation step of that method.
Figure 5:
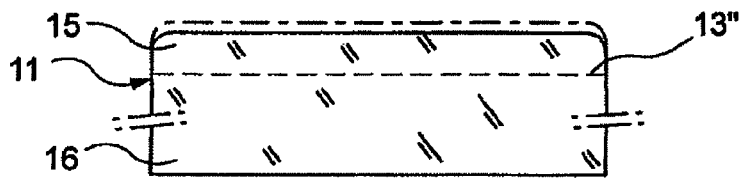
FIG. 5 is a diagram of a heat processing step of that method.
Figure 6:
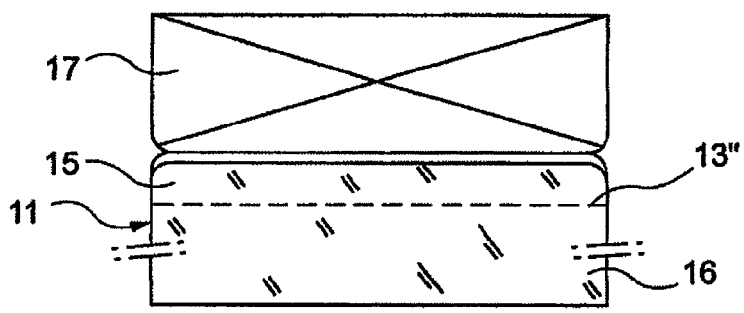
FIG. 6 is a diagram showing bringing into intimate contact with a second substrate.
Figure 7:
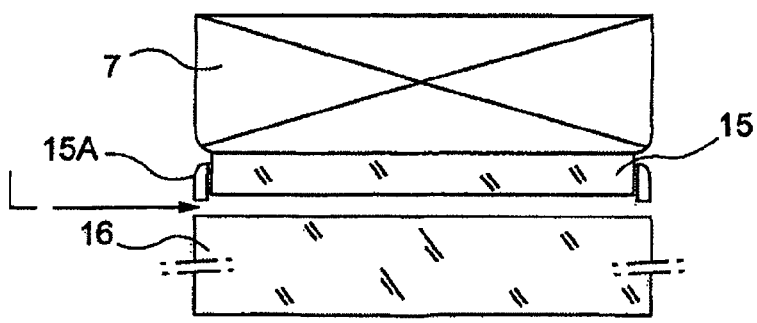
FIG. 7 is a diagram showing the separation of the starting substrate into a thin layer and a substrate remainder ready to be recycled.

FIGS. 3 to 7 represent the main steps of one example of a method of the invention for fabrication of a thin layer of GaN:

1) first implantation of a GaN starting substrate 11, by means of bombardment with helium, symbolized by arrows 12, to form an implanted layer 13, this implantation being carried out at a dose between of the order of $10^{17}$/cm$^2$ and of the order of $4.10^{17}$/cm$^2$, 2) second implantation of this starting substrate 11, by means of bombardment with hydrogen, symbolized by the arrows 12', this implantation being carried out at a dose between of the order of $10^{17}$/cm$^2$ and $4.10^{17}$/cm$^2$, 3) embrittlement treatment step, in practice including a heat treatment, preferably at low temperature, for a given time, this treatment corresponding to the application of a thermal (or thermo-mechanical if mechanical stresses are applied) budget advantageously representing at least 85% of the thermal (or thermo-mechanical) budget that would be necessary to obtain separation or fracture by this heat treatment alone, 4) bringing this implanted substrate into intimate contact with a second substrate 17, also called the host substrate, 5) application of a residual fracture treatment to separate the starting structure into a thin layer 15 (possibly including remainder fragments 15A) and a substrate remainder 16 ready to be recycled and to undergo the aforementioned implantation steps again.

The steps 3 to 5 conjointly constitute a fracture treatment adapted to cause detachment from the remainder of the starting substrate of all the portion of the GaN area situated between the free face through which the implantation was effected and the implantation depth of the hydrogen. A particularly simple version of the method of the invention is limited, for example, to conducting the step 3 until detachment of the required thin layer.

The starting substrate 11 here consists entirely of GaN. Alternatively, as in the case of FIG. 1, it can be a substrate of which only a thick surface area, along the free face of the substrate, is of GaN, this area being a layer carried by a support that can consist of sapphire. This area is sufficiently thick for the implantations to be effected within the thickness of this area.

The thermal (or thermo-mechanical) budget concept corresponds to the energy input in thermal or thermo-mechanical form leading to fracture, and the percentage indicated is in practice given with reference to the time that would be necessary to attain that energy at constant temperature and (where applicable) stress.

The heat treatment of step 3, combined or not with the application of stresses, causes the defects introduced by the implantations to evolve so as to form an embrittled layer 13" substantially at the level of the layer 13 separating the future thin layer 15 and the future remainder 16. The surface 14 can be covered with a protective layer 18, for example of oxide, before or after the implantation steps, which layer 18 can be removed or not before the bringing into contact with the second substrate (step 4).

The invention resides particularly in the particular choice of the conditions of implantation in the GaN, the effect of which is that the steps 1 and 2 lead to the formation of defects that in one particular embodiment evolve with temperature. Thus the person skilled in the art knows that implantation of gaseous ions (H, He, etc.) in a substrate (Si, Ge, GaN, etc.) leads to the formation of defects and microcavities at a depth that depends primarily on the ions implanted, the substrate and the implantation energy. If a heat treatment is applied to the implanted substrate (without bonding beforehand to a stiffener), the defects normally evolve in size and in density until they form, substantially at the implantation depth, microcracks containing a gaseous phase of the implanted ion. Under the effect of the pressure of the gas, these microcracks then lead to local deformation of the free surface of the substrate in the form of blisters, or even local detachment in the form of exfoliation.

On the other hand, the implantation conditions specified for the invention lead to the formation in the GaN of defects that evolve differently with temperature. These original conditions, following appropriate heat treatment, and even without the application of a stiffener substrate, lead to total detachment of the implanted surface film 15, without localized exfoliation or formation of blisters. This delamination has appeared to be linked to the particular nature of the implantation defects generated by the conditions of the invention, and not to a limited implantation energy (see PCT Patent Application Publication No. WO-A-2003/063213 which teaches a relationship between dose and implantation energy to obtain substantially complete exfoliation during a fracture treatment executed entirely after bonding to a stiffener).

It follows from this that the conditions of implantation and heat treatment of the invention are capable of provoking for GaN complete fracture of the starting substrate in the region of the hydrogen implantation area without the presence of an effective stiffener being necessary (as the person skilled in the art has previously thought).

Because the presence of a stiffener to prevent local exfoliation or to maintain the flatness of the delaminated layer is not necessary, the invention teaches that it is advantageous to carry out the heat treatment (known as "superembrittlement") with no stiffener substrate, in particular, with no massive stiffener (one with a thickness greater than several microns), and therefore without limits associated with any difference in coefficient of thermal expansion between the two substrates, and this treatment can be carried out "virtually to the end", in such a manner as to enable, if required, and just before separation, fixing to any substrate to facilitate manipulation of the thin layer after separation (remember that, in practice, the separation of a thin layer from the remainder of the starting substrate, after the starting substrate has been fixed to a second substrate, is defined as a transfer step because the thin layer, initially forming part of the starting substrate, is in the end attached to the second substrate). Thanks to the invention, even the areas not bonded to the second substrate (in particular the peripheral areas, the areas of defects in the substrate, and the areas of lack of bonding corresponding to areas P, C, and I from FIG. 1) are detached thanks to an appropriate fracture treatment.

According to one aspect of the invention, this heat treatment can be accompanied by mechanical stresses.

If a transfer is to be effected, this "superembrittlement" step must not be conducted until it ends in fracture in the microcavities layer, but can advantageously represent at least 85%, even 85% or at least 99% (for example 99.99%) of the fracture thermal (and/or thermo-mechanical) budget, even though, to avoid untimely fracture, it may appear prudent not to exceed 99%, for example.

The step of bringing into intimate contact with the second substrate 7 forming a host is advantageously carried out by bonding (preferably molecular bonding), and can involve the use of a bonding layer deposited on the surface 14 of the GaN substrate as well as or instead of the protection layer 18.

Heat treatment to strengthen this bonding can be provided, and either participate or not in the evolution of the defects in the layer 13" (thus the thermal budget includes two steps).

The final fracture step consists in heat and/or mechanical treatment. The thermo-mechanical budget to be applied is inversely proportional to the super-embrittlement treatment. The step of transferring the thin film onto the second substrate can be carried out at room temperature, and thus without heat treatment, simply by application of mechanical stresses, for example by insertion of a blade.

However, as it may prove difficult to apply mechanical treatment to some non-bonded areas, a heat treatment is advantageously chosen for the detachment of the areas in vertical alignment with those non-bonded areas.

As a consequence of the fracture step, the thin film 15 is detached entirely from the substrate initially implanted, including in locally non-bonded areas such as those labeled C or I in FIG. 1 and including those at the periphery (reference P in FIG. 1). The detachment of these areas P (or even these areas C or I) can be simultaneous with detachment of the usable part (in practice the central part of the film) transferred to the second substrate (for example after appropriate heat treatment) or necessitate a specific fracture treatment before or after detachment of this usable portion. Recycling of the initial substrate 1 after complete fracture therefore necessitates no costly step of mechanical and/or chemical leveling to remove non-transferred areas (as is the case at present in a standard process).

According to the applications, the recycling can be prepared through a simple step of light mechanical-chemical polishing that reduces surface roughness after fracture with minimum removal of material (at most one micron, typically of the order of 0.01 nm or of the order of 0.2 microns). Depending on requirements, the substrates can be recycled directly after the fracture step, with no particular surface treatment, for example to carry out further GaN transfers.

Particular embodiments of the method of the invention are described hereinafter.

EXAMPLE 1

A GaN ($^{70}$Ga $^{14}$N) crystalline substrate is implanted with He ions under the following conditions: energy=90 keV, dose=$2.10^{17}$ cm$^2$, then with H ions under the following conditions: energy=60 keV, dose=$2.10^{17}$ cm$^2$. A protection layer of SiO$_2$ of thickness that can be chosen between 500 nm and 1 μm is then deposited by the PECVD (Plasma Enhanced Chemical Vapor Deposition) process onto the implanted substrate. 280° C.-1 h superembrittlement annealing is then applied (i.e. for 1 hour at 280° C. with no additional mechanical stress).

Note that 280° C.-1 h annealing represents ~85% of the fracture thermal budget at 280° C., since under these conditions fracture is obtained after 280° C.-1 h10.

It has been noted that the implantation depths obtained in this way were 390 nm for He and 450 nm for hydrogen, i.e. were substantially equal (to within 60 nm).

Moreover, the very operation of PECVD deposition of the protection layer can induce heating and thus contribute to superembrittlement of the substrate.

The GaN substrate is then bonded by molecular adhesion to a bulk sapphire stiffener, by the following steps:
chemical cleaning of the GaN and sapphire substrates,
mechanical-chemical polishing,
bringing of the substrates into contact.

Fracture is then caused in the implanted layer by a heat treatment. GaN and sapphire having different coefficients of thermal expansion (GaN: ~$5.8.10^{-6}$/K, sapphire: ~$8.10^{-6}$/K), the temperature of the fracture heat treatment must be sufficiently low to prevent unbonding of the structure. It has been considered here that the fracture heat treatment must be carried out at T°<230° C. The superembrittlement then enables fracture to be obtained at 230° C. in ~13 h. Without the superembrittlement step, the fracture time (i.e. the fracture thermal budget) would have been 88 h at 230° C.

This 230° C.-13 h fracture step leads to the detachment of a film (or thin layer) of GaN ~480 nm thick, in principle over the whole of the surface of the implanted GaN substrate. Nevertheless, it can happen that a central portion of the GaN film is first transferred to the sapphire substrate (thus a GaN/SiO$_2$/sapphire structure is obtained that can be used to produce light-emitting diodes (LED), for example). Another portion localized to the ring of the GaN substrate is detached from the substrate in the form of an annular self-supporting membrane (symbolized by the ring 15A in FIG. 7). The remainder 16 of the initially implanted GaN substrate 11 can then be recycled directly after fracture to effect a number of successive transfers, with no intermediate step of specific surface preparation between each transfer cycle, the aforementioned steps being nevertheless applied to this remainder 6, and then to the remainder of that remainder after a new transfer, and so on.

It has been verified that photos representing the remainder of a standard transfer (after hydrogen implantation) show very clearly a change of appearance in the peripheral portion, as well as at localized places (within the central area), while photos taken under the same conditions have revealed an entirely homogeneous appearance after fracture by the steps described above.

EXAMPLE 2

A GaN ($^{70}$Ga $^{14}$N) crystalline substrate is covered with a bonding layer of SiO$_2$ of 500 nm thickness, deposited by the LPCVD (Low Pressure Chemical Vapor Deposition) process at 900° C. This substrate is implanted with He ions under the following conditions: energy=210 keV, dose=$2.10^{17}$ cm$^{-1}$, then with H ions under the following conditions: energy=120 keV, dose=$2.10^{17}$ cm$^{-2}$. Superembrittlement annealing of 300° C.-44 min is then applied.

Note that a 300° C.-44 min annealing represents ~97.7% of the fracture thermal budget at 300° C. since, under these conditions, fracture is obtained after 300° C.-45 min.

It has been found that the depths of implantation obtained in this way were 750 nm for He and 700 nm for hydrogen, i.e. that they were substantially equal (to within 50 nm).

The GaN substrate with the bonding layer is then bonded by molecular adhesion to a sapphire substrate. Fracture is then caused in the implanted layer by a heat treatment at T°<230° C. The superembrittlement then enables fracture to be obtained at 220° C. in ~16 h. Without the superembrittlement step, the fracture time (i.e. the thermal budget of this final fracture step) would have been 30 days at 220° C.

The 220° C.-16 h fracture step leads to the detachment of a film of GaN of ~480 nm thickness and of the 500 nm SiO$_2$ bonding layer over the whole of the area of the implanted GaN substrate. As indicated above with reference to example 1, a portion of the GaN film is transferred onto the sapphire substrate; a GaN/SiO$_2$/sapphire structure is thus obtained which can be used for example to produce light-emitting diodes (LED). Another portion, localized to the ring of the GaN substrate, is detached from the substrate in the form of a self-supporting membrane. The initially implanted GaN substrate is then recycled for further transfers, after a step of simple resurfacing by CMP (for example a few seconds of mechanical-chemical polishing) to eliminate the roughness associated with the fracture.

EXAMPLE 3

A GaN ($^{70}$Ga $^{14}$N) crystalline substrate is covered with an SiO$_2$ bonding layer of 250 nm thickness, deposited by the PECVD (Plasma Enhanced Chemical Vapor Deposition) process at 300° C. This substrate is implanted with He ions under the following conditions: energy=90 keV, dose=$3.10^{17}$ cm$^{-2}$, and then with H ions under the following conditions: energy=60 keV, dose=$10^{17}$ cm$^{-2}$. Superembrittlement annealing of 495° C.-4 h10 min is then applied. Note that a 495° C.-4 h10 min annealing represents ~98% of the fracture thermal budget at 495° C. since under these conditions fracture is obtained after 495° C.-4 h15.

It was found that the implantation depths obtained in this way were 390 nm for He and 450 nm for hydrogen, i.e. that they were substantially equal (to within 60 nm).

The GaN substrate with the bonding layer is then bonded by molecular adhesion to a sapphire substrate. The bonding is then consolidated by annealing at low temperature, for example 150° C.-2 h. This type of annealing does not contribute significantly to superembrittlement of the implanted GaN substrate, this annealing temperature being too low; it therefore makes no contribution to the energy budget already expended on the starting support.

Fracture is then caused in the implanted layer by application of mechanical stresses. For this purpose a blade is inserted between the two bonded substrates, for example (see the arrow L in FIG. 7). A portion of the GaN film is transferred onto the sapphire substrate, and there is obtained in this way a GaN/SiO$_2$/sapphire structure that can be used to produce light-emitting diodes (LED), for example. Because the residual fracture treatment is essentially mechanical, portions insufficiently bonded (exclusion areas, NBA, etc.) are not detached from the GaN substrate, but annealing at 400° C.-1 min eliminates these residual areas on the GaN substrate in the form of a self-supporting membrane. The whole of the GaN film is therefore detached, and there is obtained on the remainder of the starting substrate a plane surface with no reliefs. This remainder of the initially implanted GaN substrate can then be recycled for further transfers.

Quality delamination in a GaN substrate has in fact been observed, under the aforementioned implantation conditions, for very varied pairs of helium and hydrogen doses, respectively, between $10^{17}$ atoms/cm$^2$ and $4.10^{17}$ atoms/cm$^2$, notably the following pairs, with regard to which note that they correspond to total doses between 3 and 4, preferably between 3.5 and 4 (expressed in units corresponding to $10^{17}$ atoms/cm$^2$):

| | | |
|---|---|---|
| He = 2 | H = 1 | i.e. a total of 3, |
| He = 2 | H = 1.5 | i.e. a total of 3.5, |
| He = 1.75 | H = 2 | i.e. a total of 3.75, |
| He = 2 | H = 2 | i.e. a total of 4, and |
| He = 3 | H = 1 | i.e. a total of 4. |

Quality delamination, under the same implantation conditions as before, has even been found with implantation of only helium, i.e. with He=4 and H=0.

This makes it possible to conclude that, in this range of implantation doses, if the helium implantation dose is sufficiently high (at least equal to approximately $3.10^{17}$ atoms/cm$^2$, typically between $3.5\ 10^{17}$ atoms/cm$^2$ and $4.5^{17}$ atoms/cm$^2$, even between $3.75\ 10^{17}$ atoms/cm$^2$ and $4.25\ 10^{17}$ atoms/cm$^2$), very good delamination is also obtained, with a good surface quality on the faces obtained by the fracture, in the absence of complementary hydrogen implantation.

The invention claimed is:

1. A method of fabrication of a thin layer of GaN from a starting substrate of which at least a thick surface area along a free face of the starting substrate comprises GaN, the method comprising the following steps:
    bombarding the free face of the starting substrate with helium ions and hydrogen ions, wherein the helium ions are implanted first in the thick surface area and the hydrogen ions are implanted second, and wherein implantation doses of the helium ions and the hydrogen ions each range between $1.10^{17}$ atoms/cm$^2$ and $4.10^{17}$ atoms/cm$^2$; and
    applying a fracture treatment to the starting substrate adapted to cause a detachment of the thick surface area between the free face and an implantation depth of the helium ions and of the hydrogen ions from a remainder of the starting substrate.

2. The method according to claim 1, wherein the implantation dose of the helium ions is at least equal to the implantation dose of the hydrogen ions.

3. The method according to claim 1 or claim 2, further comprising recycling the remainder of the starting substrate after applying the fracture treatment.

4. The method according to claim 3, further comprising treating the remainder of the starting substrate, before its recycling, comprising at most one polishing of at most 1 micron thickness.

5. The method according to claim 1, further comprising bringing the starting substrate into intimate contact with a host substrate via the free face before applying the fracture treatment.

6. The method according to claim 5, bringing the starting substrate into intimate contact comprises molecular bonding.

7. The method according to claim 5 or claim 6, further comprising depositing at least one layer on the free surface of the starting substrate before bringing the starting substrate into intimate contact with the host substrate.

8. The method according to claim 5 further comprising applying the fracture treatment by applying an embrittlement treatment including a heat treatment to the starting substrate before bringing the starting substrate into intimate contact with the host substrate, and wherein the heat treatment corresponds to at least 85% of the thermo-mechanical budget necessary for obtaining the fracture of the starting substrate at the implantation depth of the hydrogen ions, the method further comprising applying a residual fracture treatment after bringing the starting substrate into intimate contact with the host substrate.

9. The method according to claim 8, wherein applying the embrittlement treatment further comprises depositing a layer in vapor form.

10. The method according to claim 8 or claim 9, wherein applying the embrittlement treatment further comprises applying mechanical stresses.

11. The method according to claim 8, wherein applying the embrittlement treatment comprises applying the heat treatment at a temperature of at most 400° C.

12. The method according to claim 8, wherein applying the embrittlement treatment furnishes a thermo-mechanical budget of at least 95% of the thermo-mechanical budget necessary to obtain the detachment of the thick surface area.

13. The method according to claim 8, wherein applying the residual fracture treatment includes applying a heat treatment.

14. The method according to claim 13, wherein applying the residual fracture treatment comprises applying the heat treatment at a temperature at most 250° C.

15. The method according to claim 8, wherein applying the residual fracture treatment includes applying mechanical stresses.

16. The method according to claim 15, wherein applying the residual fracture treatment comprises applying the treatment at room temperature.

17. The method according to claim 15 or claim 16, wherein applying the residual fracture treatment includes applying an ultrasound treatment.

18. The method according to claim 15 or claim 16, wherein applying the residual fracture treatment includes the applying microwaves.

19. The method according to claim 1, wherein helium ion implantation dose ranges between $1.10^{17}$ and $2.10^{17}$ He$^+$/cm$^2$.

20. The method according to claim 1, wherein the hydrogen ion implantation dose ranges between $1.10^{17}$ and $2.10^{17}$ H$^+$/cm$^2$.

21. The method according to claim 1, wherein a cumulative implantation dose is between approximately $3.10^{17}$ atoms/cm$^2$ and $4.5\ 10^{17}$ atoms/cm$^2$.

22. The method according to claim 1, wherein an implantation energy of the helium ion implantation is greater than an implantation energy of the hydrogen ion implantation.

23. The method according to claim 1, wherein an implantation energy of the helium ions is between 90 keV and 210 keV and an implantation energy of the hydrogen ions is between 60 keV and 120 keV.

24. The method according to claim 1, further comprising applying a finishing heat treatment for perfecting the detachment of all the thin layer, including in any non-bonded areas.

* * * * *